US012805364B2

(12) United States Patent
Ahn et al.

(10) Patent No.: US 12,805,364 B2
(45) Date of Patent: Nov. 17, 2026

(54) ANODIC ALUMINUM OXIDE FILM-BASED INTERPOSER FOR ELECTRICAL CONNECTION

(71) Applicant: POINT ENGINEERING CO., LTD., Chungcheongnam-do (KR)

(72) Inventors: Bum Mo Ahn, Gyeonggi-do (KR); Seung Ho Park, Gyeonggi-do (KR); Sung Hyun Byun, Gyeonggi-do (KR)

(73) Assignee: POINT ENGINEERING CO., LTD, Chungcheongnam-do (KR)

( * ) Notice: Subject to any disclaimer, the term of this patent is extended or adjusted under 35 U.S.C. 154(b) by 403 days.

(21) Appl. No.: 18/285,389

(22) PCT Filed: Mar. 23, 2022

(86) PCT No.: PCT/KR2022/004064

§ 371 (c)(1),
(2) Date: Oct. 3, 2023

(87) PCT Pub. No.: WO2022/215907

PCT Pub. Date: Oct. 13, 2022

(65) Prior Publication Data

US 2024/0112968 A1 Apr. 4, 2024

(30) Foreign Application Priority Data

Apr. 6, 2021 (KR) ........................ 10-2021-0044806

(51) Int. Cl.
*H10W 70/68* (2026.01)
*H10W 72/00* (2026.01)
(Continued)

(52) U.S. Cl.
CPC ....... *H10W 70/6875* (2026.01); *H10W 90/00* (2026.01); *H10W 72/01235* (2026.01);
(Continued)

(58) Field of Classification Search
CPC ............. H10W 70/6875; H10W 90/00; H10W 90/701; H10W 90/724; H10W 72/01235; H10W 72/252
See application file for complete search history.

(56) References Cited

U.S. PATENT DOCUMENTS

2008/0311749 A1 12/2008 Savastiouk et al.
2014/0085829 A1* 3/2014 Yamashita ........... H05K 1/0204 361/717
2021/0118794 A1* 4/2021 Ding ...................... H10D 1/692

FOREIGN PATENT DOCUMENTS

CN 1674269 9/2005
CN 103794554 5/2014
(Continued)

OTHER PUBLICATIONS

"Notification of Review Opinions of Taiwan Counterpart Application", issued on Aug. 20, 2025, with English translation thereof, p. 1-p. 30.
(Continued)

*Primary Examiner* — Richard A Booth
(74) *Attorney, Agent, or Firm* — JCIPRNET

(57) ABSTRACT

Proposed are an anodic aluminum oxide film-based interposer for electrical connection and a manufacturing method therefor, a semiconductor package and a manufacturing method therefor, a multi-stacked semiconductor device and a manufacturing method therefor, and a display and a manufacturing method therefor that can cope with a narrow pitch between terminals and prevent an increase in current density and thermal energy density in a bump connection part. To this end, proposed is an interposer for electrical connection, in which a through-hole is provided in a body made of anodic aluminum oxide film and a first bonding material, an electrically conductive material, and a second bonding material are formed in the through-hole by electro-
(Continued)

plating. Here, fine trenches having repeated peaks and valleys in the circumferential direction are provided in an outer circumferential surface of a micro-bump.

4 Claims, 24 Drawing Sheets

(51) Int. Cl.
*H10W 72/20* (2026.01)
*H10W 90/00* (2026.01)

(52) U.S. Cl.
CPC ........ *H10W 72/252* (2026.01); *H10W 90/701* (2026.01); *H10W 90/724* (2026.01)

(56) References Cited

FOREIGN PATENT DOCUMENTS

| | | |
|---|---|---|
| CN | 108977856 | 12/2018 |
| CN | 109576645 | 4/2019 |
| CN | 112038362 | 12/2020 |
| JP | 2005217264 | 8/2005 |
| KR | 20130134757 | 12/2013 |
| KR | 20140040668 | 4/2014 |
| KR | 101465361 | 11/2014 |
| KR | 101610326 | 4/2016 |
| TW | 201414392 | 4/2014 |

OTHER PUBLICATIONS

"International Search Report (Form PCT/ISA/210) of PCT/KR2022/004064", mailed on Jul. 8, 2022, with English translation thereof, pp. 1-5.
"Written Decision on Registration of Korea Counterpart Application, Application No. 10-2021-0044806", issued on Dec. 15, 2025, with English translation thereof, p. 1-p. 5.
"Notification of Review Opinions of Taiwan Counterpart Application, Application No. 111111300", issued on Jan. 15, 2026, with English translation thereof, p. 1-p. 40.

* cited by examiner

ANODIC ALUMINUM OXIDE FILM-BASED INTERPOSER FOR ELECTRICAL CONNECTION

CROSS-REFERENCE TO RELATED APPLICATION

This application is a 371 of international application of PCT application serial no. PCT/KR2022/004064, filed on Mar. 23, 2022, which claims the priority benefit of Korea application no. 10-2021-0044806, filed on Apr. 6, 2021. The entirety of each of the above mentioned patent applications is hereby incorporated by reference herein and made a part of this specification.

TECHNICAL FIELD

The present disclosure relates to an anodic aluminum oxide film-based interposer for electrical connection and a manufacturing method therefor, a semiconductor package and a manufacturing method therefor, a multi-stacked semiconductor device and a manufacturing method therefor, and a display and a manufacturing method therefor.

BACKGROUND ART

With an increasing trend of semiconductor devices toward miniaturization, multifunction, high performance, and high capacity, packaging technology is gaining increasing importance as a core technology that ultimately determines the electrical performance, reliability, and productivity of products, and miniaturization of electronic systems. Packaging technology refers to a series of processes that ultimately commercialize semiconductor devices made in a wafer process. Recently, in order to further increase the mounting efficiency per unit volume, technologies have been emerging, such as a ball grid array (BGA), a chip-size package (CSP) which has approximately the same size as a chip, and a multi-chip module (MCM) which stacks chips on top of each other or arranges multiple semiconductor devices with different functions in one package. In particular, recently, as electronic devices become miniaturized and are increasingly thinned, high speed, high performance, and high-density packaging have been required in packaging technology that protects semiconductor devices from the external environment. In response to these demands, a flip-chip bonding method is used in which bare devices obtained from a wafer are directly bonded to a substrate.

A conventional flip-chip bonding method using solder bumps has been generally used because it is advantageous over a wire bonding method in that the electrical performance is excellent due to a minimized connection length between a chip and a substrate, the degree of integration of input/output terminals is high, and the internal heat can be rapidly dissipated by distributing the heat dissipation path.

However, with the recent trend of semiconductor devices toward the integration of multiple functions in one chip and faster processing speed, the number of input/output terminals has been increased and the pitch between the terminals has been increasingly reduced.

As the pitch between the terminals has become narrower, the pitch between solder bumps has also naturally become narrower. However, in the case of the conventional method using the solder bumps, there is a high possibility that when a solder bump is melted, a short-circuit occurs between adjacent solder bumps. In addition, as the size of the solder bump having a spherical shape is reduced, the current density and thermal energy density increase in a bump connection part.

Meanwhile, micro-light-emitting diode (micro-LED) displays have emerged as another type of next generation display. Liquid crystal and organic materials are the core materials of liquid-crystal displays (LCDs) and organic light-emitting diodes (OLEDs), respectively, whereas the micro-LED display uses 1 μm to 100 μm LED chips themselves as a light emitting material. Since the micro-LED has a terminal size and pitch in micrometer (μm) unit, the above-mentioned problems also occur in bonding the micro-LED to a substrate (circuit board) using the conventional method using the solder bumps.

DOCUMENTS OF RELATED ART

Patent Documents (Patent Document 1) Korean Patent No. 10-1610326

DISCLOSURE

Technical Problem

Accordingly, the present disclosure has been made keeping in mind the above problems occurring in the related art, and an objective of the present disclosure is to provide an anodic aluminum oxide film-based interposer for electrical connection and a manufacturing method therefor, a semiconductor package and a manufacturing method therefor, a multi-stacked semiconductor device and a manufacturing method therefor, and a display and a manufacturing method therefor that can cope with a narrow pitch between terminals and prevent an increase in current density and thermal energy density in a bump connection part.

Technical Solution

In order to accomplish the above objective, according to one aspect of the present disclosure, there is provided a method of manufacturing an anodic aluminum oxide film-based interposer for electrical connection, the method including: preparing a body made of an anodic aluminum oxide film and having a seed layer thereunder; forming a plurality of through-holes in the body; forming a first bonding material in each of the through-holes by electroplating using the seed layer; forming an electrically conductive material on the first bonding material by electroplating using the first bonding material; forming a second bonding material on the electrically conductive material by electroplating using the electrically conductive material; and removing the seed layer.

In addition, the electrically conductive material may be made of at least one selected from among Cu, Al, W, Au, Ag, Mo, Ta, and an alloy containing these metals, and the first and second bonding materials may be made of at least one selected from among Sn, AgSn, Au, PbSn, SnAgCu, SnAgBi, AuSn, In, InSn, and an alloy containing Sn.

In addition, the through-holes may have a circular cross-section.

Meanwhile, according to another aspect of the present disclosure, there is provided an anodic aluminum oxide film-based interposer for electrical connection, the interposer including: a body made of an anodic aluminum oxide film having a plurality of through-holes; an electrically conductive material provided in each of the through-holes;

and a bonding material provided in each of the through-holes and provided at least a part of on and under the electrically conductive material.

In addition, the electrically conductive material may be made of at least one selected from among Cu, Al, W, Au, Ag, Mo, Ta, and an alloy containing these metals, and the bonding material may be made of at least one selected from among Sn, AgSn, Au, PbSn, SnAgCu, SnAgBi, AuSn, In, InSn, and an alloy containing Sn.

In addition, the bonding material may include: a first bonding material provided under the electrically conductive material; and a second bonding material provided on the electrically conductive material.

In addition, the bonding material and the electrically conductive material may have the same height as a height of the body.

Meanwhile, according to another aspect of the present disclosure, there is provided a semiconductor package, including: a semiconductor device; a substrate on which the semiconductor device is mounted; and an interposer for electrical connection provided between the semiconductor device and the substrate. Here, the interposer for electrical connection may include: a body made of an anodic aluminum oxide film having a plurality of through-holes; an electrically conductive material provided in each of the through-holes; and a bonding material provided in each of the through-holes and provided at least a part of on and under the electrically conductive material.

Meanwhile, according to another aspect of the present disclosure, there is provided a semiconductor package, including: a semiconductor device; a substrate on which the semiconductor device is mounted; and an interposer for electrical connection provided under the substrate. Here, the interposer for electrical connection may include: a body made of an anodic aluminum oxide film having a plurality of through-holes; an electrically conductive material provided in each of the through-holes; and a bonding material provided in each of the through-holes and provided at least a part of on and under the electrically conductive material.

Meanwhile, according to another aspect of the present disclosure, there is provided a multi-stacked semiconductor device, including: a plurality of semiconductor devices; and an interposer for electrical connection provided between the semiconductor devices. Here, the interposer for electrical connection may include: a body made of an anodic aluminum oxide film having a plurality of through-holes; an electrically conductive material provided in each of the through-holes; and a bonding material provided in each of the through-holes and provided at least a part of on and under the electrically conductive material.

Meanwhile, according to another aspect of the present disclosure, there is provided a method of manufacturing a semiconductor package formed by mounting a semiconductor device on a substrate, the method including: providing an interposer for electrical connection between the semiconductor device and the substrate, the interposer comprising a body made of an anodic aluminum oxide film having a plurality of through-holes, an electrically conductive material provided in each of the through-holes, and first and second bonding materials formed on and under the electrically conductive material; and bonding the first bonding material to a terminal of the substrate and bonding the second bonding material to a terminal of the semiconductor device.

Meanwhile, according to another aspect of the present disclosure, there is provided a method of manufacturing a semiconductor package formed by mounting a semiconductor device on a substrate, the method including: providing an interposer for electrical connection under the substrate, the interposer comprising a body made of an anodic aluminum oxide film having a plurality of through-holes, an electrically conductive material provided in each of the through-holes, and first and second bonding materials formed on and under the electrically conductive material; and bonding the second bonding material to a terminal of the substrate.

In addition, the method may further include: removing the body made of the anodic aluminum oxide film.

Meanwhile, according to another aspect of the present disclosure, there is provided a method of manufacturing a multi-stacked semiconductor device by stacking a plurality of semiconductor devices, the method including: providing an interposer for electrical connection between the semiconductor devices, the interposer comprising a body made of an anodic aluminum oxide film having a plurality of through-holes, an electrically conductive material provided in each of the through-holes, and first and second bonding materials formed on and under the electrically conductive material; and bonding the first bonding material to a terminal of a semiconductor device located thereabove and bonding the second bonding material to a terminal of a semiconductor device located therebelow.

In addition, the method may further include: removing the body made of the anodic aluminum oxide film.

Meanwhile, according to another aspect of the present disclosure, there is provided a semiconductor package, including: a semiconductor device; a substrate on which the semiconductor device is mounted; and a plurality of micro-bumps provided between the semiconductor device and the substrate. Here, the micro-bumps may have a column shape, and a plurality of fine trenches having repeated peaks and valleys in a circumferential direction may be provided in an outer circumferential surface of each of the micro-bumps.

Meanwhile, according to another aspect of the present disclosure, there is provided a semiconductor package, including: a semiconductor device; a substrate on which the semiconductor device is mounted; and a plurality of micro-bumps provided under the substrate. Here, the micro-bumps may have a column shape, and a plurality of fine trenches having repeated peaks and valleys in a circumferential direction may be provided in an outer circumferential surface of each of the micro-bumps.

Meanwhile, according to another aspect of the present disclosure, there is provided a multi-stacked semiconductor device, including: a plurality of semiconductor devices; and a plurality of micro-bumps provided between the semiconductor devices. Here, the micro-bumps may have a column shape, and a plurality of fine trenches having repeated peaks and valleys in a circumferential direction may be provided in an outer circumferential surface of each of the micro-bumps.

Meanwhile, according to another aspect of the present disclosure, there is provided a display, including: a semiconductor device; a substrate on which the semiconductor device is mounted; and a plurality of micro-bumps provided between the semiconductor device and the substrate. Here, the micro-bumps may have a column shape, and a plurality of fine trenches having repeated peaks and valleys in a circumferential direction may be provided in an outer circumferential surface of each of the micro-bumps.

Advantageous Effects

The present disclosure provides an anodic aluminum oxide film-based interposer for electrical connection and a manufacturing method therefor, a semiconductor package and a manufacturing method therefor, a multi-stacked semiconductor device and a manufacturing method therefor, and a display and a manufacturing method therefor that can cope with a narrow pitch between terminals and prevent an increase in current density and thermal energy density in a bump connection part.

MODE FOR INVENTION

Figure 1:
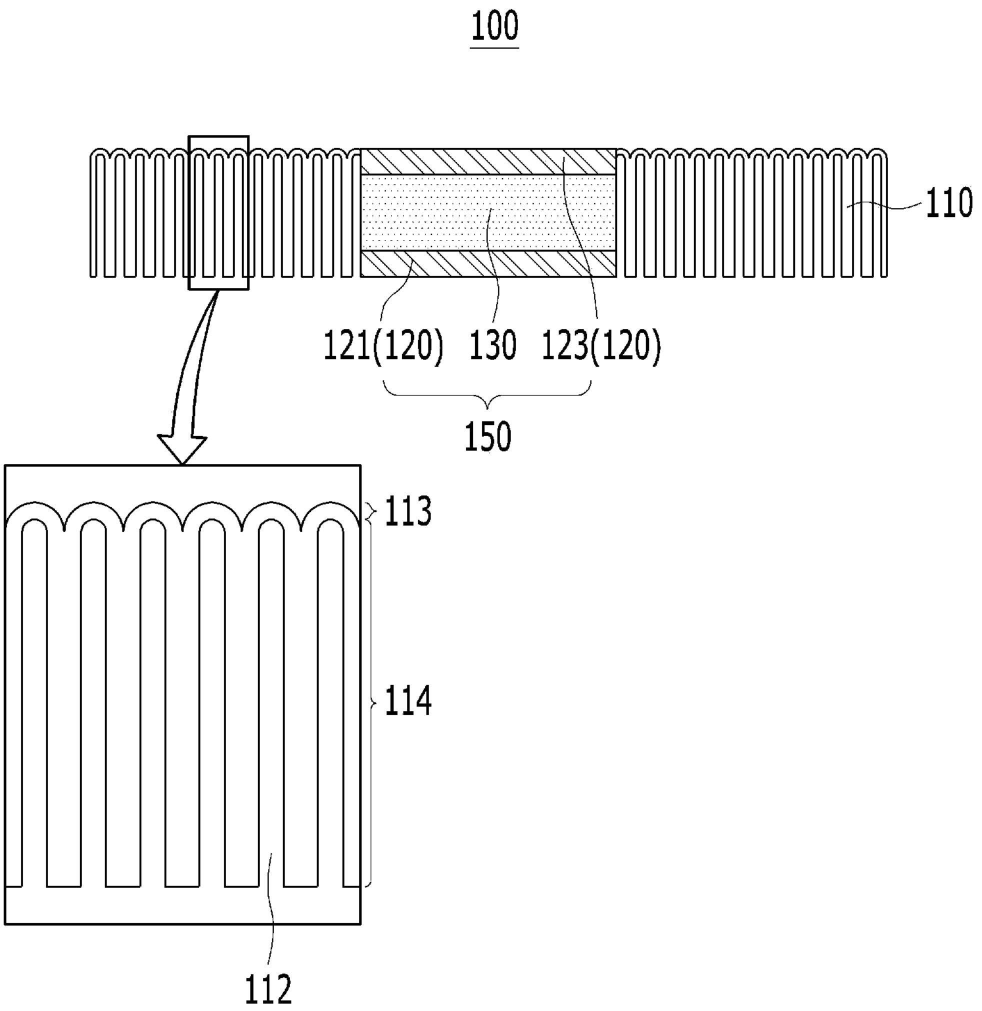
FIG. 1 is a sectional view illustrating an anodic aluminum oxide film-based interposer for electrical connection according to an exemplary embodiment of the present disclosure.

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that the present disclosure is not limited to the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, thicknesses of films and regions in the figures may be exaggerated. Therefore, variations from the shapes of the illustrations as a result, for example, of manufacturing techniques and/or tolerances, are to be expected. In addition, a limited number of micro-bumps are illustrated in the drawings by way of example. Thus, the embodiments should not be construed as limited to the particular shapes of regions illustrated herein but are to include deviations in shapes that result, for example, from manufacturing. The technical terms used herein are for the purpose of describing particular embodiments only and should not be construed as limiting the present disclosure. As used herein, the singular forms are intended to include the plural forms as well, unless the context clearly indicates otherwise. It will be further understood that the terms "comprise", "include", "have", etc. when used herein, specify the presence of stated features, integers, steps, operations, elements, components, and/or combinations thereof but do not preclude the presence or addition of one or more other features, integers, steps, operations, elements, components, and/or combinations thereof.

Hereinafter, exemplary embodiments of the present disclosure will be described in detail with reference to the accompanying drawings. Wherever possible, the same reference numerals will be used throughout different embodiments and the description to refer to the same or like elements or parts. In addition, the configuration and operation already described in other embodiments will be omitted for convenience.

A semiconductor device 10 to be described below may be a memory chip, a microprocessor chip, a logic chip, a light-emitting device, which have fine-pitched chip terminals, or a combination thereof. The semiconductor device 10 is not particularly limited and examples thereof include a logic LSI (such as an ASIC, an FPGA, and an ASSP), a microprocessor (such as a CPU and a GPU), a memory (such as a DRAM and a hybrid memory cube (HMC), a magnetic RAM (MRAM), a phase-change memory (PCM), a resistive RAM (ReRAM), a ferroelectric RAM (FeRAM), a flash memory (such as NAND flash), a semiconductor light-emitting device (such as an LED, a mini LED, and a micro-LED), a power device, an analog IC (such as a DC-AC converter and an insulating gate bipolar transistor (IGBT)), an MEMS (such as an acceleration sensor, a pressure sensor, a vibrator, and a gyro sensor), a wireless device (such as a GPS, an FM, an NFC, an RFEM, an MMIC, and a WLAN), a discrete device, a BSI, a CIS, a camera module, a CMOS, a passive device, a GAW filter, an RF filter, an RF IPD, an APE, and a BB.

In addition, a substrate 20 to be described below includes a circuit board, a wiring board, a package substrate, a temporary substrate, an intermediate substrate, and the like, and also includes all substrates electrically connected to the semiconductor device 10 directly or indirectly.

Hereinafter, first, an anodic aluminum oxide film-based interposer for electrical connection according to an exemplary embodiment of the present disclosure and a manufacturing method therefor will be described.

FIG. 1 is a sectional view illustrating the anodic aluminum oxide film-based interposer 100 for electrical connection according to the exemplary embodiment of the present disclosure. FIGS. 2A, 2B, 2C, and 2D are views illustrating a manufacturing method for the anodic aluminum oxide film-based interposer 100 for electrical connection according to the exemplary embodiment of the present disclosure.

Referring to FIG. 1, the anodic aluminum oxide film-based interposer 100 for electrical connection according the embodiment of the present disclosure includes: a body 110 made of an anodic aluminum oxide film and having a plurality of through-holes 111; an electrically conductive material 130 provided in each of the through-holes 111; and a bonding material 120 provided in each of the through-holes 111 and provided at least part of on and under the electrically conductive material 130.

The body 110 is made of the anodic aluminum oxide film.

The body 110 is composed only of the anodic aluminum oxide film formed by anodizing a base metal and then removing the base metal. The anodic aluminum oxide film means a film formed by anodizing a metal as a base material, and pores 112 mean holes formed in the process of forming the anodic aluminum oxide film by anodizing the metal.

As an embodiment, when the base metal is aluminum (Al) or an aluminum alloy, the anodization of the base metal forms the anodic aluminum oxide film consisting of anodized aluminum ($Al_2O_3$) on a surface of the base metal. However, the base metal is not limited thereto, and includes Ta, Nb, Ti, Zr, Hf, Zn, W, Sb, or an alloy of these metals.

The anodic aluminum oxide film may include a porous layer 114 in which the pores 112 are formed therein and a barrier layer 113 in which one of the top and bottom of the pores 112 is closed. The barrier layer 113 is formed on top of the base material during the anodization, and the porous layer 114 is formed on one side of the barrier layer 113. Specifically, when anodizing the base metal, the barrier layer 113 is formed first on the base metal, and then when the barrier layer 113 reaches a predetermined thickness, the porous layer 114 is formed on the barrier layer 113. The thickness of the barrier layer 113 may vary depending on the process conditions for anodization, but is preferably in the range of several tens of nm to several μm, and more preferably in the range of 100 nm to 1 μm. The thickness of the porous layer 114 may also vary depending on the process conditions for anodization, but is preferably in the range of several tens of nm to several hundreds of μm. The diameter of the pores 112 constituting the porous layer 114 may be in the range of several nm to several hundreds of nm. After the anodization process is completed, a process of removing the metal base material is performed. As a result, the anodic aluminum oxide film consisting of anodized aluminum (Al2O3) remains. The body 110 uses the anodic aluminum oxide film as described above.

The body 110 may be a body 110 in which the barrier layer 113 formed during the anodization is provided on at least one surface thereof to close one of the top and bottom of the pores 112, or a body 110 in which the barrier layer 113 formed during the anodization is removed from least one surface thereof to expose the top and bottom of the pores 112. As described above, the body 110 may be provided with both the porous layer 114 and the barrier layer 113, or may be provided with only the porous layer 114 by removing the barrier layer 113.

The electrically conductive material 130 may be made of at least one selected from among Cu, Al, W, Au, Ag, Mo, Ta, and an alloy containing these metals. The bonding material 120 may be made of at least one selected from among Sn, AgSn, Au, PbSn, SnAgCu, SnAgBi, AuSn, In, InSn, and an alloy containing Sn. For example, the electrically conductive material 130 may be made of copper (Cu) or an alloy containing copper (Cu) as a main component, and the bonding material 120 may be made of tin (Sn) or an alloy containing tin (Sn) as a main component.

The bonding material 120 and the electrically conductive material 130 are formed to have the same height as that of the body 110. The bonding material 120 includes a first bonding material 121 provided under the electrically conductive material 130 and a second bonding material 123 provided on the electrically conductive material 130.

The first bonding material 121 and the second bonding material 123 may be made of the same material. Alternatively, the first bonding material 121 and the second bonding material 123 may be made of different materials. In addition, the first bonding material 121 and the second bonding material 123 may have different melting points.

The manufacturing method for the anodic aluminum oxide film-based interposer 100 for electrical connection according to the exemplary embodiment of the present disclosure will be described with reference to FIGS. 2A, 2B, 2C, and 2D.

The manufacturing method for the interposer 100 for electrical connection includes: preparing a body 110 made of an anodic aluminum oxide film and having a seed layer 200 thereunder; forming a plurality of through-holes 111 in the body 110; forming a first bonding material 121 in each of the through-holes 111 by electroplating using the seed layer 200; forming an electrically conductive material 130 on the first bonding material 121 by electroplating using the first bonding material 121; forming a second bonding material on the electrically conductive material 130 by electroplating using the electrically conductive material 130; and removing the seed layer 200.

Figure 2A:
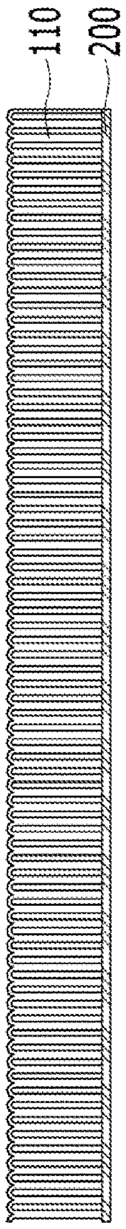
FIGS. 2A, 2B, 2C, and 2D are views illustrating a manufacturing method for the anodic aluminum oxide film-based interposer for electrical connection according to the exemplary embodiment of the present disclosure.

First, referring to FIG. 2A, the step of preparing the body 110 made of the anodic aluminum oxide film and having the seed layer 200 thereunder is performed.

The seed layer 200 is provided under the body 110 made of the anodic aluminum oxide film. The body 110 is manufactured by anodizing a base metal and then removing the base metal. The seed layer 200 is provided on one surface of the body 110 by a deposition method. The seed layer 200 is preferably made of copper (Cu) to improve plating characteristics during electroplating.

Figure 2B:
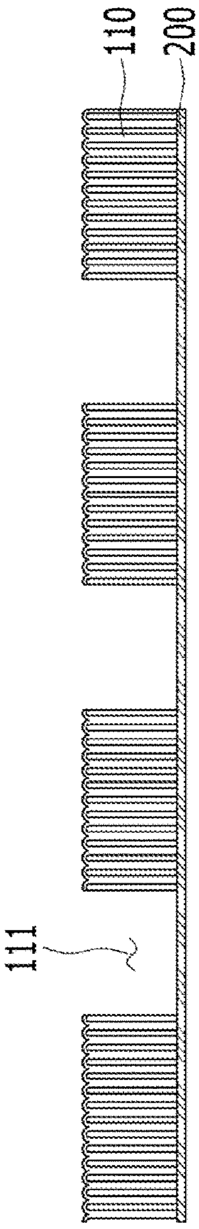

Next, referring to FIG. 2B, the step of forming the plurality of through-holes 111 in the body 110 is performed.

The body 110 has the through-holes 111 provided separately from pores 112 and having a width greater than that of the pores 112. The through-holes 111 may be formed to have a width in the range of several μm to several hundreds of μm. The through-holes 111 may be provided by an etching process. In forming the through-holes 111, the through-holes 111 may be simultaneously formed by a single etching process using an etching solution (e.g., alkali solution) that wet-reacts with the anodic aluminum oxide film. This is advantageous in terms of production speed and manufacturing cost compared to the technology of forming one via hole at one time.

The through-holes 111 may be formed by forming a photoresist on one surface of the body 110, patterning the photoresist to form openings, and then flowing the etching solution through the openings. Thus, the through-holes 111 have a cross-sectional shape that corresponds to the shape of the patterned openings.

Since the through-holes 111 are formed by the etching process using the patterned photoresist as a mask, the cross-sectional shape of the through-holes 111 is not limited, and the through-holes 111 resulting from the reaction of the anodic aluminum oxide film with the etching solution each have a vertical inner wall.

The through-holes 111 may have a circular cross-section.

Figure 2C:
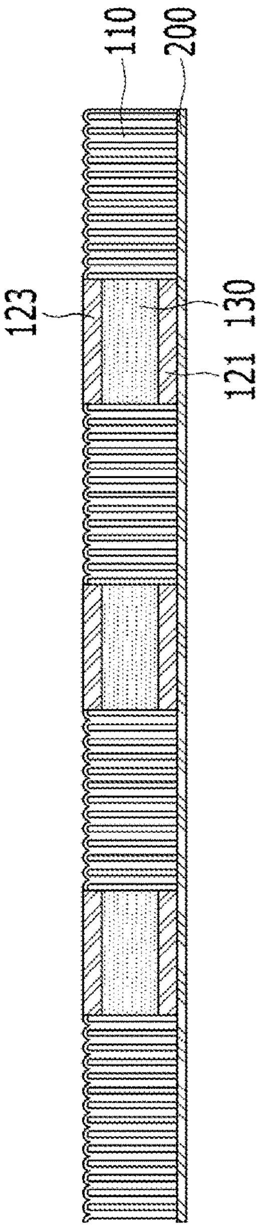

Next, referring to FIG. 2C, the step of forming the first bonding material 121 in each of the through-holes 111 by electroplating using the seed layer 200, the step of forming the electrically conductive material 130 on the first bonding material 121 by electroplating using the first bonding material 121, and the step of forming the second bonding material 123 on the electrically conductive material 130 by electroplating using the electrically conductive material 130 are performed.

As a result, the first bonding material 121, the electrically conductive material 130, and the second bonding material 123 are sequentially stacked inside each of the through-holes 111 of the body 110.

The first bonding material 121, the electrically conductive material 130, and the second bonding material 123 sequentially fill the inside of each of the through-holes 111 having the vertical inner wall to form a column-shaped micro-bump 150. The column-shaped micro-bump 150 has the same cross-sectional area from the lower surface to the upper surface of the body 110, and thus is advantageous in terms of efficient electric flow compared to, for example, a spherical or conical micro-bump that has a non-vertical inner wall. In the case of a micro-bump in which the inner wall thereof does not have a vertical shape and the cross-sectional area thereof gradually decreases from the lower surface to the upper surface thereof or gradually decreases from the peripheral portion toward the central portion thereof, a thermal and electrical bottleneck section is formed. However, the micro-bump 150 according to the exemplary embodiment of the present disclosure has no thermal and electrical bottleneck section because the cross-sectional area thereof is uniform from the lower surface to the upper surface thereof.

The micro-bump 150 may be configured in a circular column shape having a circular cross-section. With this, the micro-bump 150 has a larger volume than a conventional ball-shaped solder bump and thus has an effect of reducing current density and thermal energy density.

In addition, according to the exemplary embodiment of the present disclosure, since the bonding material 120 and the electrically conductive material 130 are formed by the plating process, it is possible to limit the height of the micro-bump 150 to the height of the through-hole 111, thereby reducing a height deviation between a plurality of micro-bumps 150.

Figure 21:
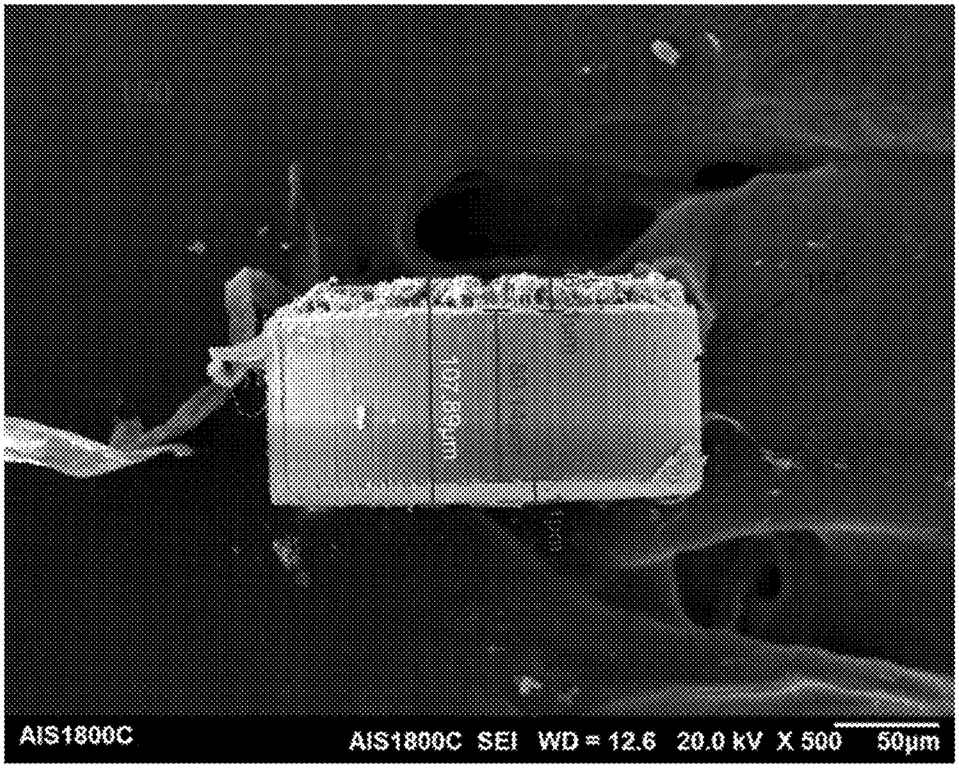
FIGS. 21 and 22 are images illustrating a micro-bump according to an exemplary embodiment of the present disclosure.
Figure 22:
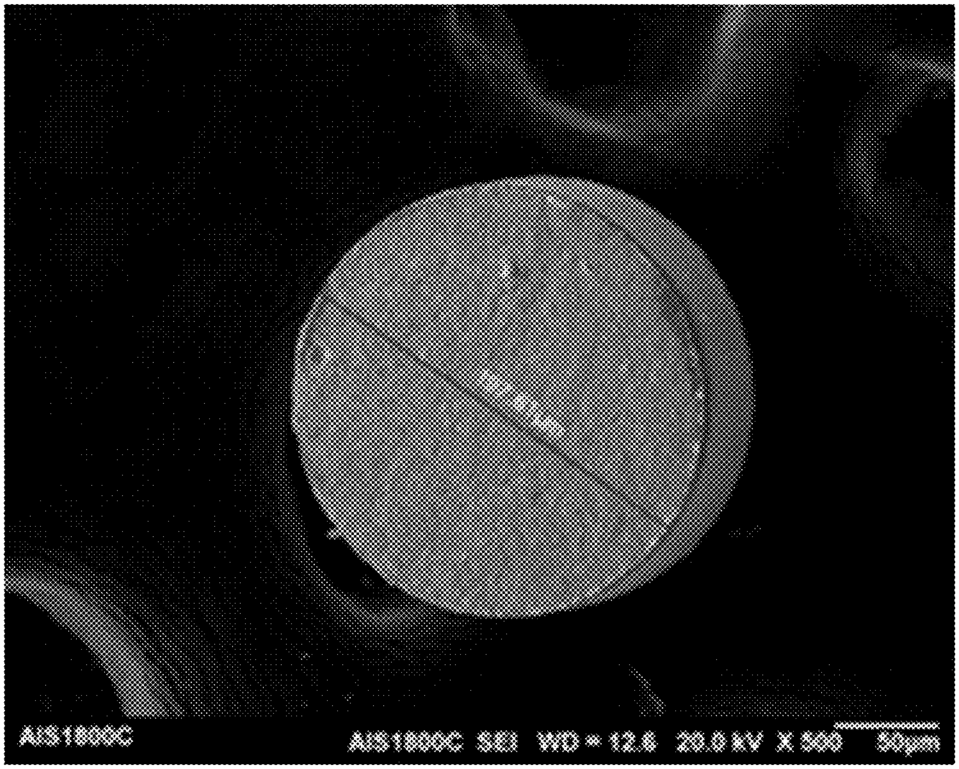

FIGS. 21 and 22 are images illustrating the micro-bump 150 formed by stacking the first bonding material 121, the electrically conductive material 130, and the second bonding material 123 according to the exemplary embodiment of the present disclosure. The micro-bump 150 is composed of the sequentially stacked first bonding material 121, electrically conductive material 130, and second bonding material 123, and has a substantially cylindrical shape.

Referring to FIGS. 21 and 22, the micro-bump 150 has a height in the range of 90 μm to 110 μm. The first bonding material 121 and the second bonding material are formed to have a height in the range of 10 μm to 20 μm, and the electrically conductive material 130 is formed to have a height in the range of 80 μm to 100 μm. In addition, the micro-bump 150 has a diameter in the range of 190 μm to 210 μm. Of course, these dimensions are only an example, and the micro-bump 150 may be formed with a smaller dimension.

Fine trenches 155 are provided in a side surface of the micro-bump 150.

The fine trenches 155 are formed in an outer circumferential surface of the micro-bump 150. In the side surface of the micro-bump 150, the fine trenches 155 are formed to extend long in the height direction of the micro-bump 150.

The fine trenches 155 have a depth in the range of 20 nm to 1 μm and a width in the range of 20 nm to 1 μm. Here, because the fine trenches 155 are resulted from the formation of the pores 112 formed during the manufacture of the body 110 made of the anodic aluminum oxide film, the width and depth of the fine trenches 155 are less than the diameter of the pores 112 formed in the body 110. On the other hand, in the process of forming the through-holes 111 in the body 110, portions of the pores 112 of the body 110 may be crushed by the etching solution to at least partially form a fine trench 155 having a depth greater than the diameter of the pores 112 formed during the anodization.

Since the body 110 includes a large number of pores 112, at least portions of the body 110 are etched to form the through-holes 111, and first bonding material 121, the electrically conductive material 130, and the second bonding material 123 are formed in each of the through-holes 111, the fine trenches 155 are provided in the side surface of the micro-bump 150 as a result of contact between the micro-bump and the pores 112 of the body 110.

The fine trenches 155 have a corrugated shape in which peaks and valleys with a depth in the range of 20 nm to 1 μm are repeated in the circumferential direction and thus have an effect of increasing the surface area of the side surface of the micro-bump 150. In other words, even when the micro-bump 150 according to the exemplary embodiment of the present disclosure has the same shape and dimensions as a conventional bump, the surface area of the side surface of the micro-bump 150 can be further increased by the configuration of the fine trenches 155. In addition, with the configuration of the fine trenches 155 formed in the side surface of the micro-bump 150, heat generated in the micro-bump 150 can be rapidly dissipated, thereby suppressing a rise in the temperature of the micro-bump 150.

Figure 2D:
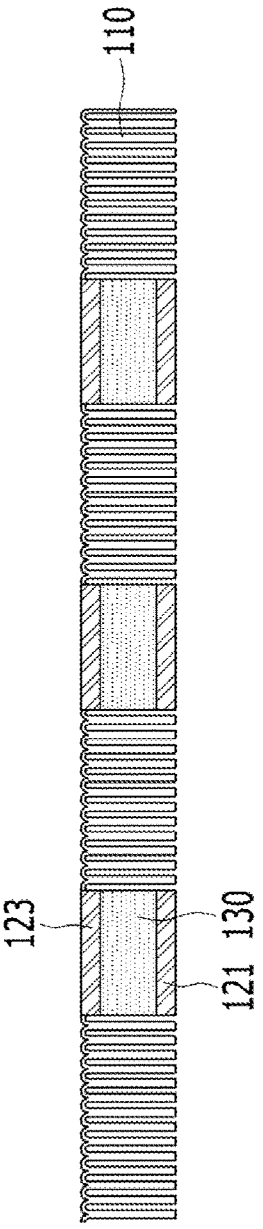

Next, referring to FIG. 2D, the seed layer 200 provided under the body 110 is removed. The seed layer 200 may be removed using a copper (Cu) etchant.

Since the body 110 of the interposer 100 for electrical connection according to the exemplary embodiment of the present disclosure is made of the anodic aluminum oxide film, in the process of bonding the micro-bump 150 to a terminal 11 of the semiconductor device 10 or a terminal 21 of the substrate 20 under high temperature conditions, the micro-bump 150 and terminals 11 and 21 can be prevented from being misaligned. The anodic aluminum oxide film has a coefficient of thermal expansion of 2 to 3 ppm/° C. With this range, the anodic aluminum oxide film only undergoes a small amount of thermal deformation due to temperature when exposed to a high temperature environment. Therefore, even when the bonding process is performed in a high temperature environment, the amount of thermal deformation of the body 110 can be minimized, making it possible to minimize a position error at the bonding position of the micro-bump 150. With this, it is possible to improve the production efficiency of a semiconductor package 400 and/or a multi-stacked semiconductor device 500 and/or a display, which will be described later.

Hereinafter, a semiconductor package 400 using an anodic aluminum oxide film-based interposer 100 for electrical connection and a manufacturing method therefor will be described.

Figure 3A:
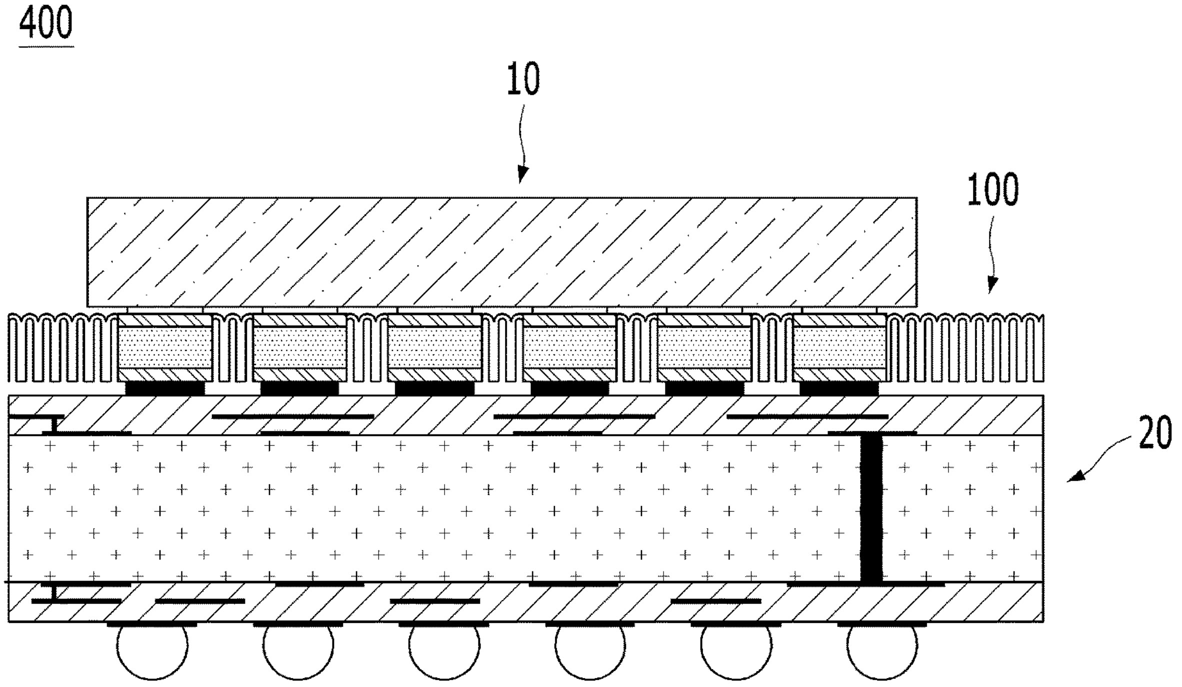
FIGS. 3A and 3B are sectional views illustrating a semiconductor package according to an exemplary embodiment of the present disclosure.
Figure 3B:
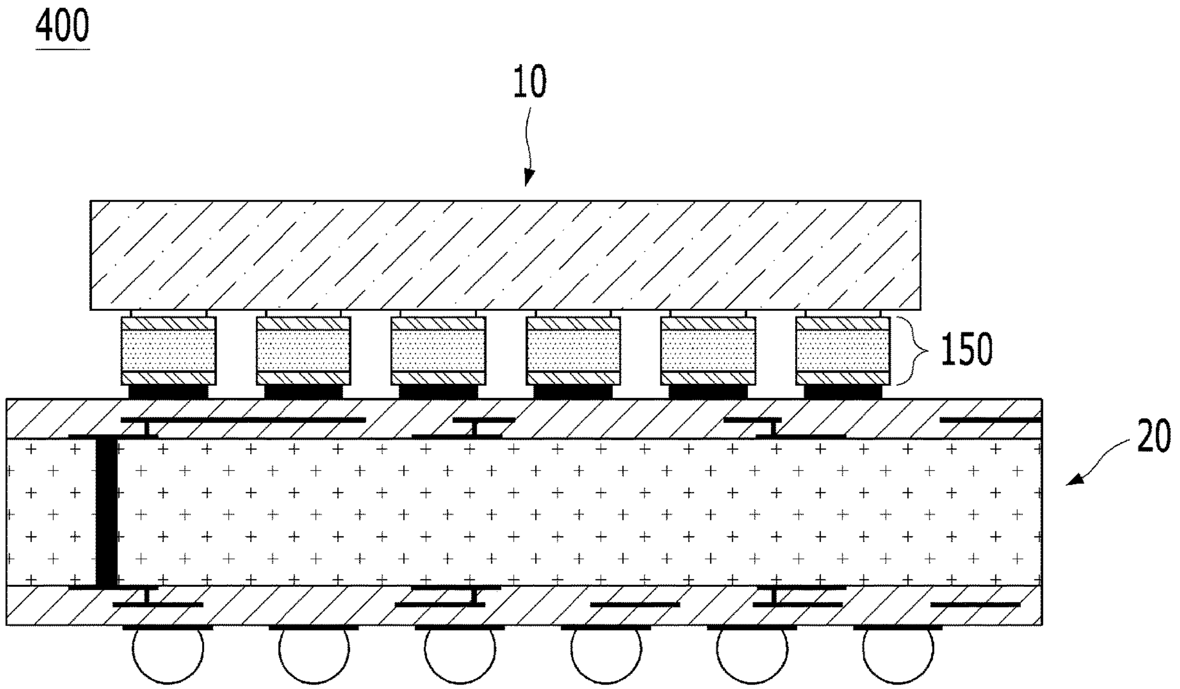

FIGS. 3A and 3B are sectional views illustrating the semiconductor package according to an exemplary embodiment of the present disclosure. FIGS. 4 to 14 are views illustrating a manufacturing method for the semiconductor package according to the exemplary embodiment of the present disclosure.

Referring to FIG. 3A, the semiconductor package 400 according to the exemplary embodiment of the present disclosure includes: a semiconductor device 10; a substrate 20 on which the semiconductor device 10 is mounted; and the interposer 100 for electrical connection provided between the semiconductor device 10 and the substrate 20. The interposer 100 for electrical connection includes: a body

110 made of an anodic aluminum oxide film having a plurality of through-holes 111; an electrically conductive material 130 provided in each of the through-holes 111; and a bonding material 120 provided in each of the through-holes 111 and provided at least a part of on and under the electrically conductive material 130.

Referring to FIG. 3B, with the body 110 made of the anodic aluminum oxide film removed, the semiconductor package 400 is configured such that the semiconductor device 10 is electrically connected to the substrate 20 through a plurality of micro-bumps 150 formed by sequentially stacking a first bonding material 121, the electrically conductive material 130, and a second bonding material 123.

That is, the semiconductor package 400 includes: the semiconductor device 10; the substrate 20 on which the semiconductor device 10 is mounted; and the plurality of micro-bumps 150 provided between the semiconductor device 10 and the substrate 20. The micro-bumps 150 are formed in a column shape. A plurality of fine trenches 155 having repeated peaks and valleys in the circumferential direction are provided in an outer circumferential surface of each of the micro-bumps 150.

In the semiconductor package 400 according to the exemplary embodiment of the present disclosure, a terminal 11 of the semiconductor device 10 and a terminal 21 of the substrate 20 are electrically connected to each other by the electrically conductive material 130, the electrically conductive material 130 and the terminal 21 of the substrate 20 are bonded by the first bonding material 121, and the electrically conductive material 130 and the semiconductor device 10 are bonded by the second bonding material 123. The bonding between the bonding material 120 and the terminals 11 and 21 may be performed through a thermo-compression process or a reflow process.

The semiconductor device 10 may be bonded in a flip-chip form on the anodic aluminum oxide film-based interposer 100. The substrate 20 is provided under the interposer 100 for electrical connection. Here, the substrate 20 may be a package substrate that supports the semiconductor device 10 and has a molding layer 300 on an upper surface thereof.

For example, the substrate 20 may include a substrate base 23, and an upper wiring layer 22 and a lower wiring layer 24 formed on upper and lower surfaces of the substrate base 23, respectively. The substrate base 23 of the substrate 20 may be made of at least one material selected from among phenol resin, epoxy resin, and polyimide. For example, the substrate base 23 may include at least one material selected from among FR4, tetrafunctional epoxy, polyphenylene ether, epoxy/polyphenylene oxide, bismaleimide triazine (BT), Thermount, cyanate ester, polyimide, and liquid crystalline polymer. An external connection terminal 25 may be provided under the lower wiring layer 24.

The manufacturing method for the semiconductor package according to the exemplary embodiment of the present disclosure will be described with reference to FIGS. 4 to 14.

The manufacturing method for the semiconductor package 400 formed by mounting a semiconductor device 10 on a substrate 20 includes: providing an interposer 100 for electrical connection between the semiconductor device 10 and the substrate 20, the interposer including a body 110 made of an anodic aluminum oxide film having a plurality of through-holes 111, an electrically conductive material 130 provided in each of the through-holes 111, and first and second bonding materials 121 and 123 formed on and under the electrically conductive material 130; and bonding the first bonding material 121 to a terminal 21 of the substrate 20 and bonding the second bonding material 123 to a terminal 11 of the semiconductor device 10.

Figure 4:
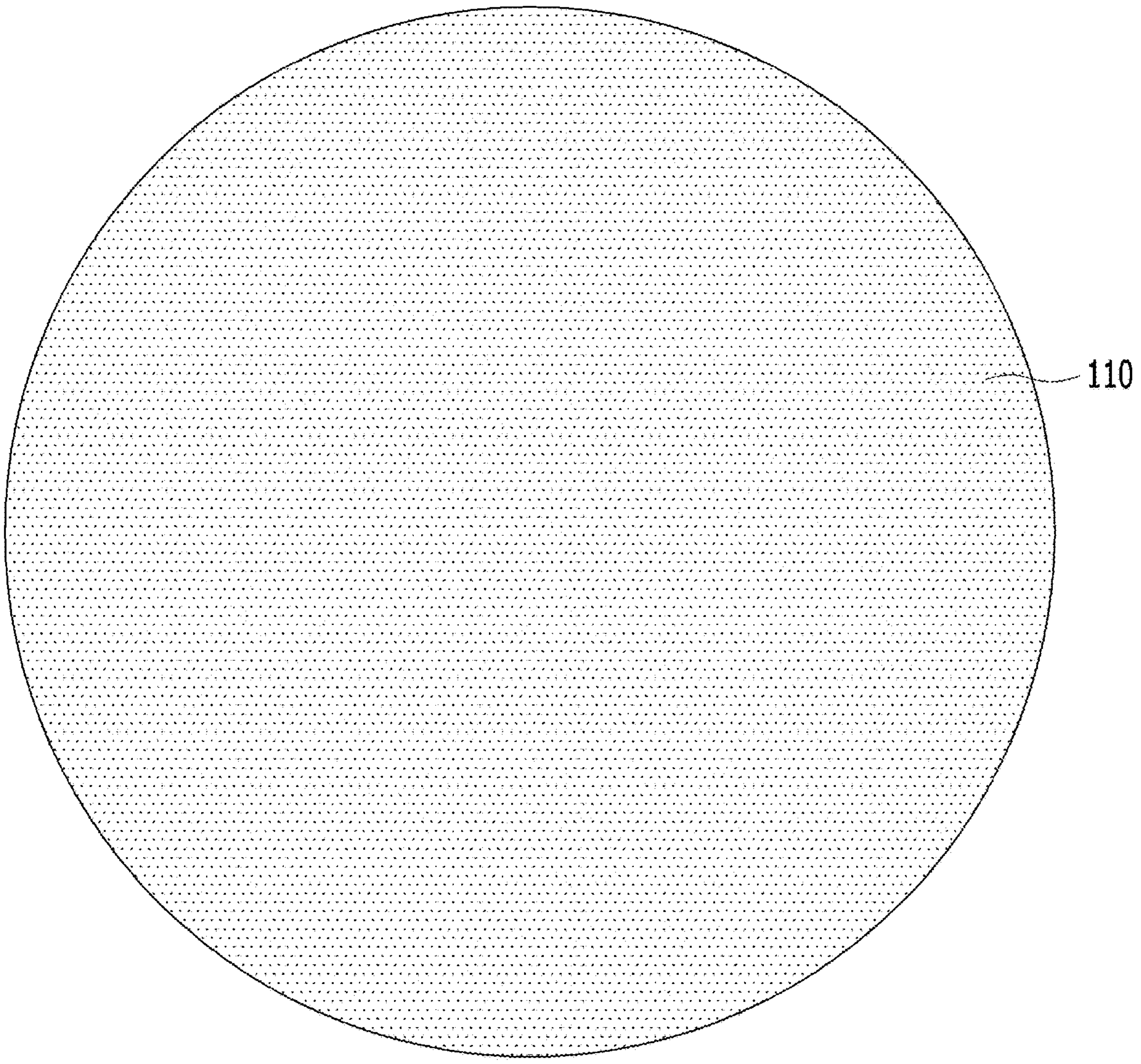
FIGS. 4 to 14 are views illustrating a manufacturing method for the semiconductor package according to the exemplary embodiment of the present disclosure.

First, referring to FIG. 4, the body 110 made of the anodic aluminum oxide film is prepared.

The body 110 is manufactured by anodization of a base metal. Pores 112 included in a porous layer 114 may be formed to have a diameter in the range of several nm to several hundreds of nm. The body 110 manufactured through the anodization may have a structure in which a barrier layer 113 formed during the anodization is provided on at least one surface thereof to close one of the top and bottom of the pores 112, or the barrier layer 113 formed during the anodization is removed from the least one surface thereof to expose the top and bottom of the pores 112. When the body 110 is manufactured to have the same size and shape as those of a wafer for manufacturing the semiconductor device 10, wafer level packaging is possible by providing the anodic aluminum oxide film-based interposer 100 between the semiconductor device 10 and the substrate 20.

In addition, since it is possible to form the body 110 made of the anodic aluminum oxide film with a thickness of equal to or greater than 100 μm, it is possible to form each micro-bump 150 with a uniform height of equal to or greater than 100 μm.

A seed layer 200 is provided under the body 110. The seed layer 200 provided under the body 110 is used in a subsequent plating process of the bonding material 120 and the electrically conductive material 130.

Figure 5:
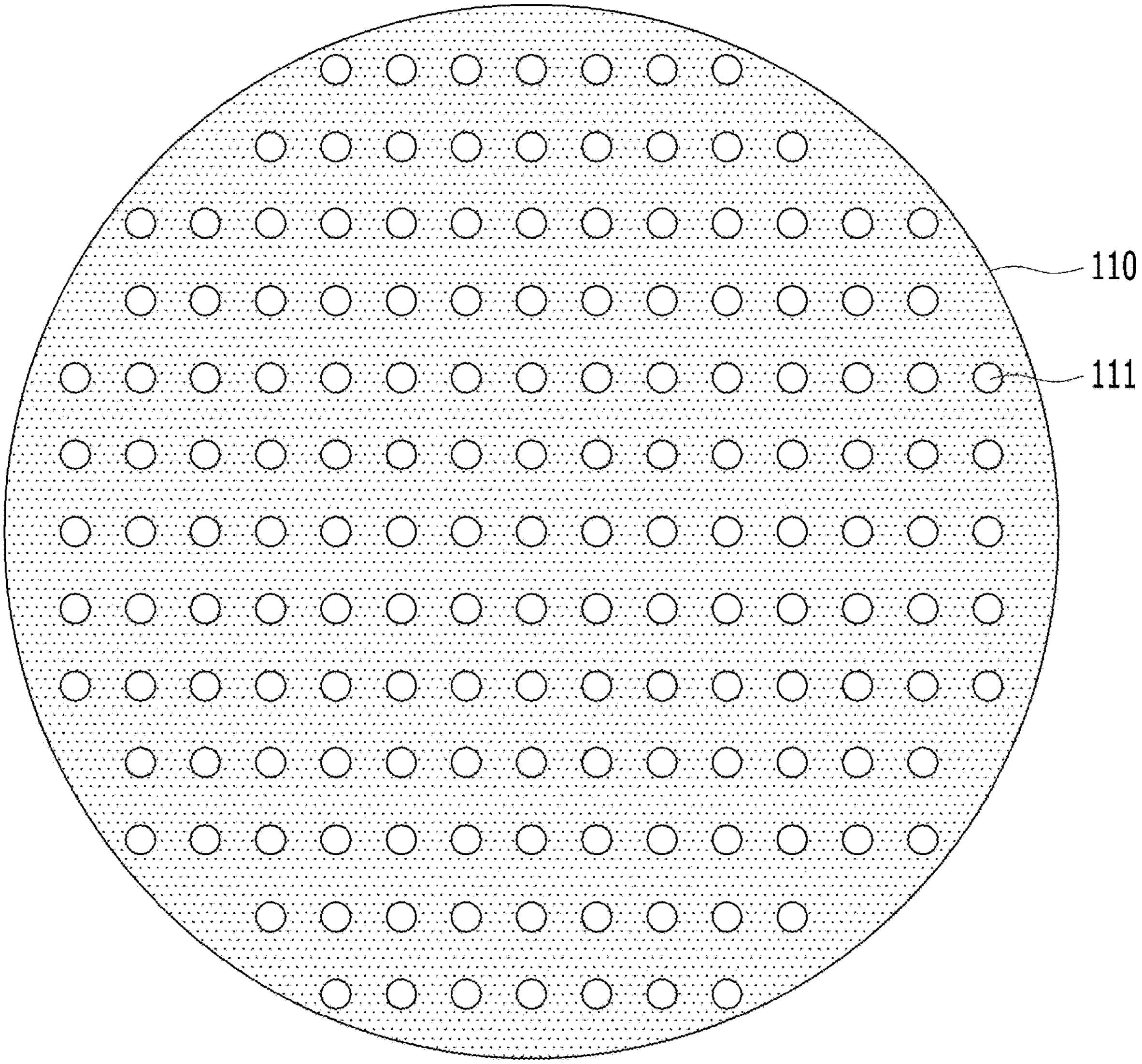

Next, referring to FIG. 5, a through-hole 111 having a width greater than that of the pores 112 is formed in the body 110 separately from the pores 112.

The through-hole 111 may be formed to have a width in the range of several μm to several tens of μm. A plurality of through-holes 111 are formed simultaneously by a single etching process. In addition, since the through-holes 111 are formed by the etching process, the cross-sectional shape of the through-holes 111 is not limited, and the through-holes 111 resulting from the reaction of the anodic aluminum oxide film with an etching solution each have a vertical inner wall. A conductive material fills the inside of each of the through-holes 111 having the vertical inner wall to form a micro-bump 150. This is advantageous in terms of efficient electric flow compared to a via conductor that has a non-vertical shape. The through-holes 111 may be formed by forming a photoresist on an upper surface of the body 110, patterning the photoresist to form openings, and then flowing the etching solution through the openings. Thus, the through-holes 111 have a cross-sectional shape that corresponds to the shape of the patterned openings. The cross-sectional shape of the through-holes 111 may be polygonal as well as circular.

Figure 6:
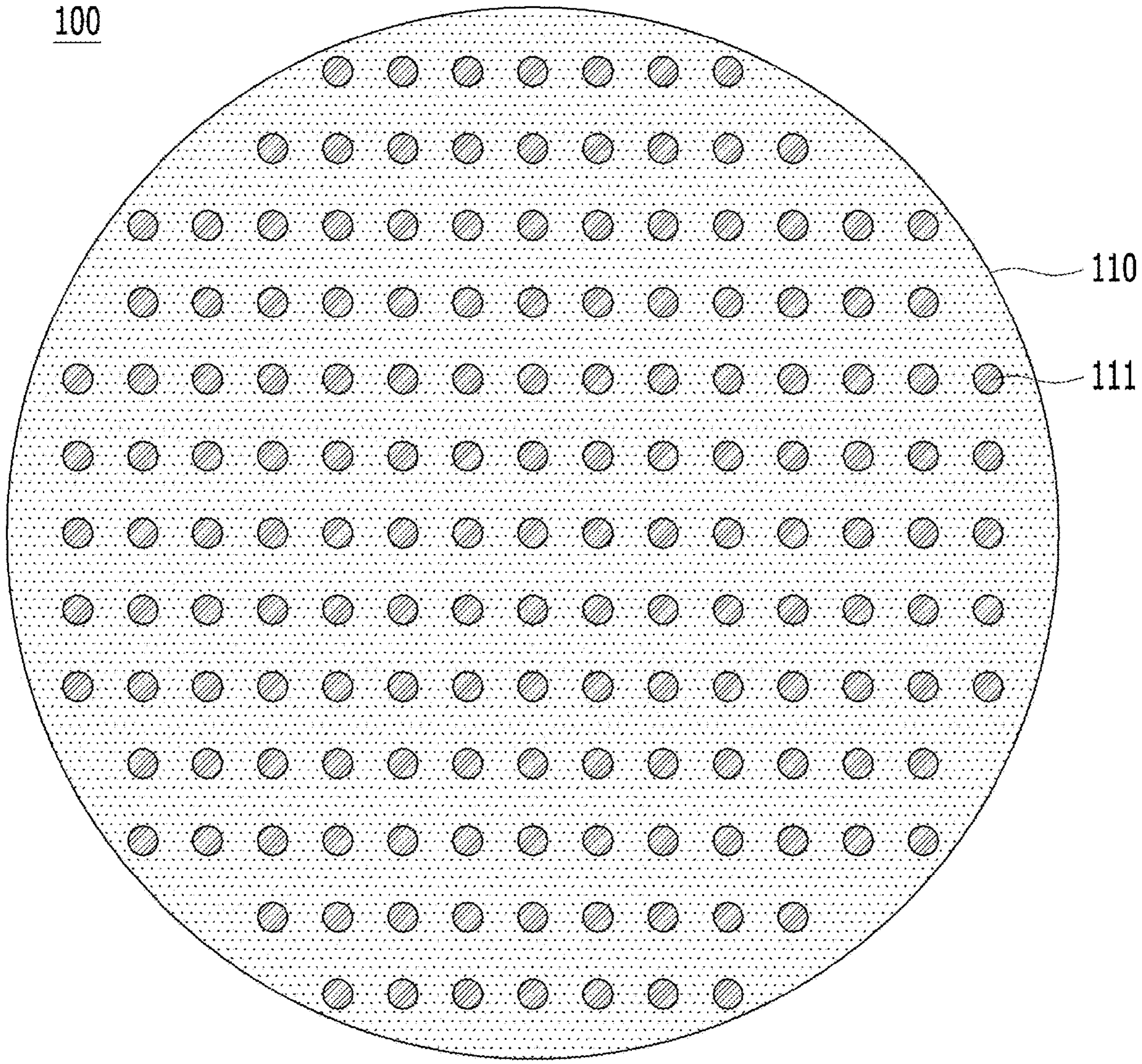
Figure 7:
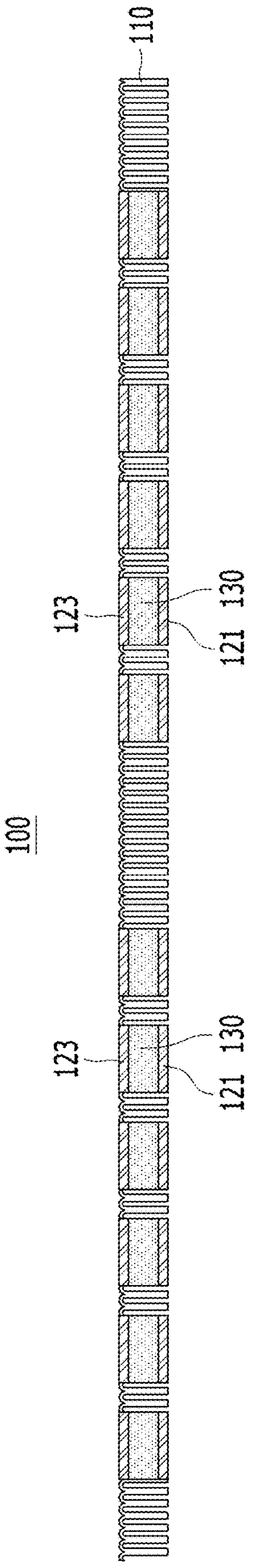

Next, referring to FIGS. 6 and 7, the first bonding material 121, the electrically conductive material 130, and the second bonding material 123 are sequentially plated in each of the through-holes 111 to form the micro-bump 150. After the second bonding material 123 is plated, a part of the second bonding material 123 protruding from the upper surface of the body 110 is removed through a chemical mechanical polishing (CMP) process.

The inside of each of the through-holes 111 is sequentially plated with the first bonding material 121, the electrically conductive material 130, and the second bonding material 123. As a result, the bonding material 120 is provided both on and under the electrically conductive material 130. The electrically conductive material 130 may be made of at least one selected from among Cu, Al, W, Au, Ag, Mo, and Ta.

The bonding material 120 may be made of at least one selected from among Sn, AgSn, Au, PbSn, SnAgCu, SnAgBi, AuSn, In, InSn, and an alloy containing Sn. For example, the electrically conductive material 130 may be made of copper (Cu) or an alloy containing copper (Cu) as a main component, and the bonding material 120 may be made of tin (Sn) or an alloy containing tin (Sn) as a main component.

When the first bonding material 121, the electrically conductive material 130, and the second bonding material 123 are provided in the through-holes 111, the interposer 100 for electrical connection is completed. The interposer 100 for electrical connection includes the body 110 made of the anodic aluminum oxide film having the through-holes 111; and the micro-bump 150 provided in each of the through-holes 111.

Since the micro-bump 150 is formed in a cylindrical shape, it has a larger volume than that in the case of a spherical shape, and since the electrically conductive material 130 is provided in a cylindrical shape, it has an effect of reducing the current density and thermal energy density concentrated on the micro-bump 150.

The body 110 having the through-holes 111 serves as a mold for electroplating in manufacturing the micro-bump 150. Since the micro-bump 150 is manufactured in each of the through-holes 111 by the plating process, the dense characteristics of the electrically conductive material 130 can be improved. As a result, it is possible to manufacture a highly reliable micro-bump 150 due to a reduced current resistance. In addition, since the micro-bump 150 is manufactured in each of the through-holes 111 by the plating process, shape precision can be improved and various cross-sectional shapes can be implemented. In addition, even when a plurality of micro-bumps 150 are formed in the body 110, a height deviation between the micro-bumps 150 can be minimized, and the volumes of the first bonding material 121 and the second bonding material 123 can be made uniform, thereby improving bonding reliability.

Since the body 110 made of the anodic aluminum oxide film includes a large number of pores 112, at least portions of the body 110 are etched to form the through-holes 111, and first bonding material 121, the electrically conductive material 130, and the second bonding material 123 are formed in each of the through-holes 111, a plurality of fine trenches 155 are provided in a side surface of the micro-bump 150 as a result of contact between the micro-bump and the pores 112 of the body 110. With the configuration of the fine trenches 155, the surface area of the micro-bump 150 can be further increased.

Next, the step of providing the interposer 100 for electrical connection between the semiconductor device 10 and the substrate 20 is performed. This step may be achieved by (i) bonding the semiconductor device 10 to the interposer 100 for electrical connection first and then bonding the interposer 100 electrical connection to the substrate 20 (FIGS. 8 to 10) or (ii) bonding the interposer 100 for electrical connection to the substrate 20 first and then bonding the semiconductor device 10 to the interposer 100 for electrical connection (FIGS. 11 and 12).

Figure 8:
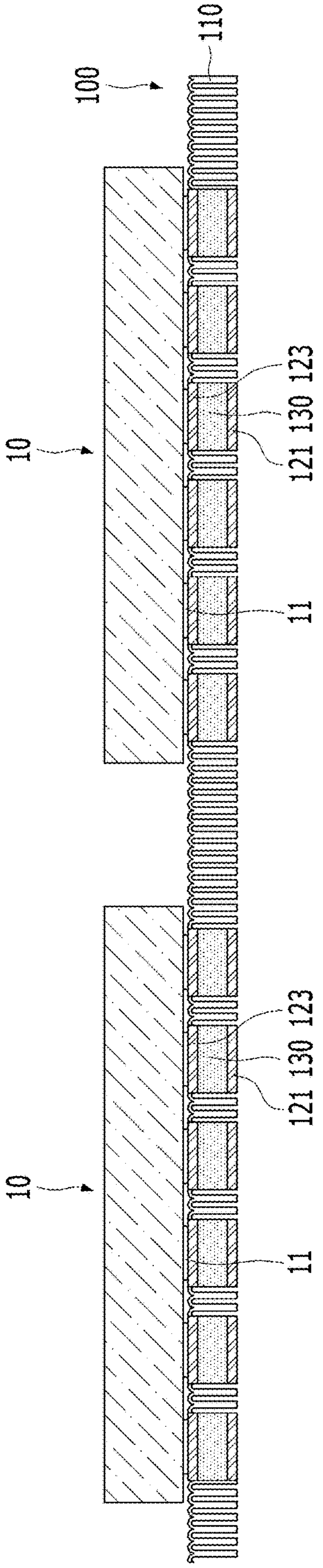

First, referring to FIG. 8, the semiconductor device 10 is mounted on an upper surface of the interposer 100 for electrical connection. Each terminal 11 of the semiconductor device 10 is bonded to correspond to each second bonding material 123 of the interposer 100 for electrical connection. Although FIG. 8 illustrates that two semiconductor devices 10 are mounted on the upper surface of the interposer 100 for electrical connection, the number of the semiconductor devices 10 is not limited thereto and the semiconductor devices 10 may be mounted in a sufficient number to enable wafer level packaging.

Figure 9:
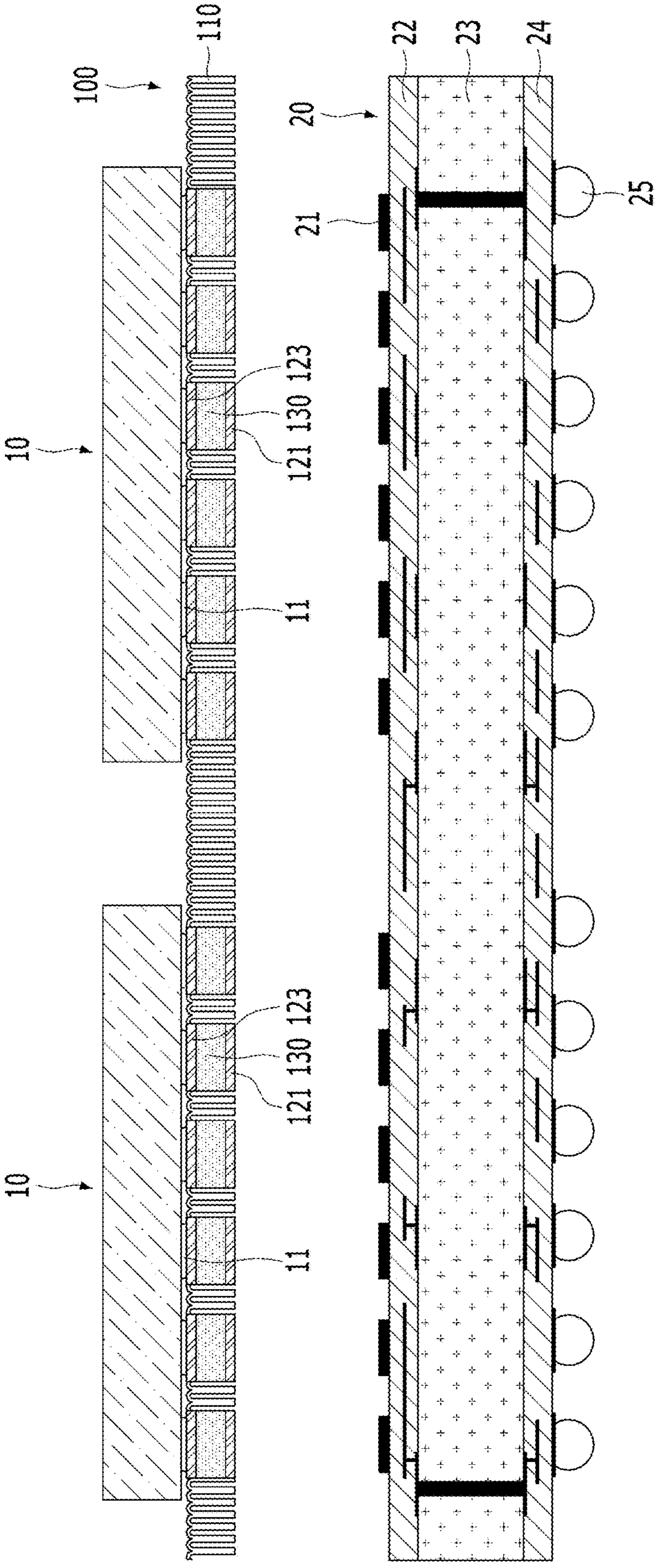
Figure 10:
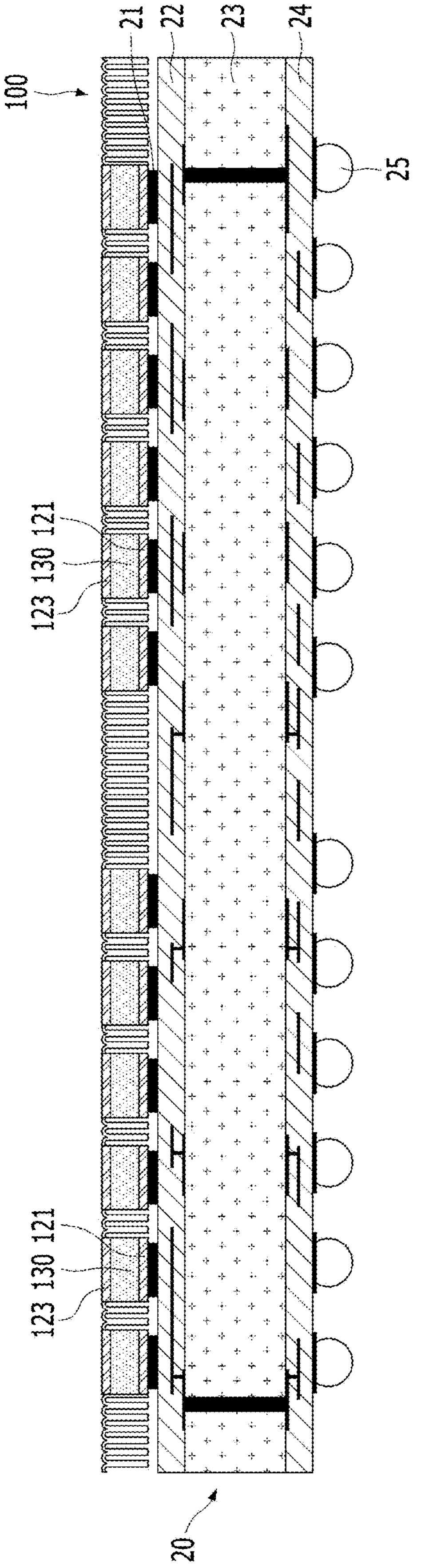

Next, referring to FIGS. 9 and 10, the interposer 100 for electrical connection on which the semiconductor devices 10 are mounted may be transferred to the substrate 20 and bonded on an upper surface of the substrate 20. On the upper surface of the substrate 20, each terminal 21 of the substrate 20 is manufactured and provided in advance at a position corresponding to each micro-bump 150 of the interposer 100 for electrical connection. Each terminal 21 of the substrate 20 is bonded to correspond to each first bonding material 121 of the interposer 100 for electrical connection.

Figure 11:
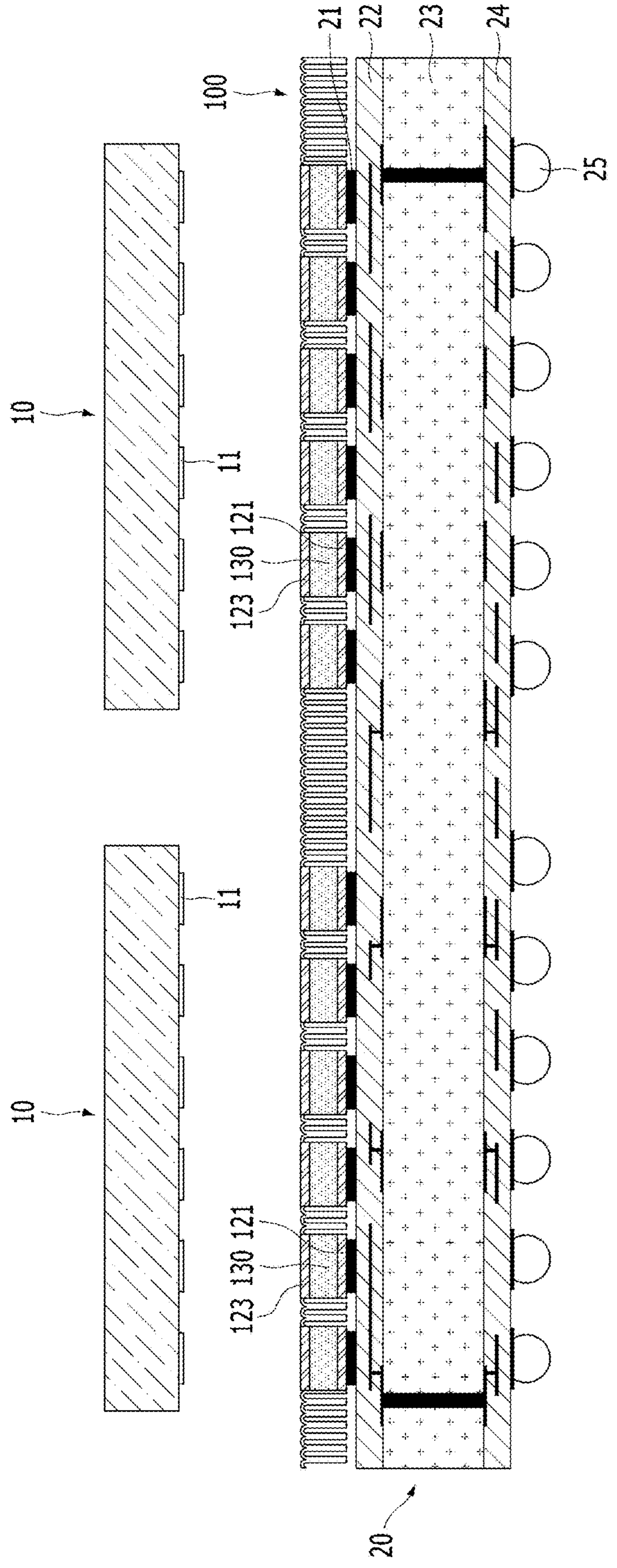
Figure 12:
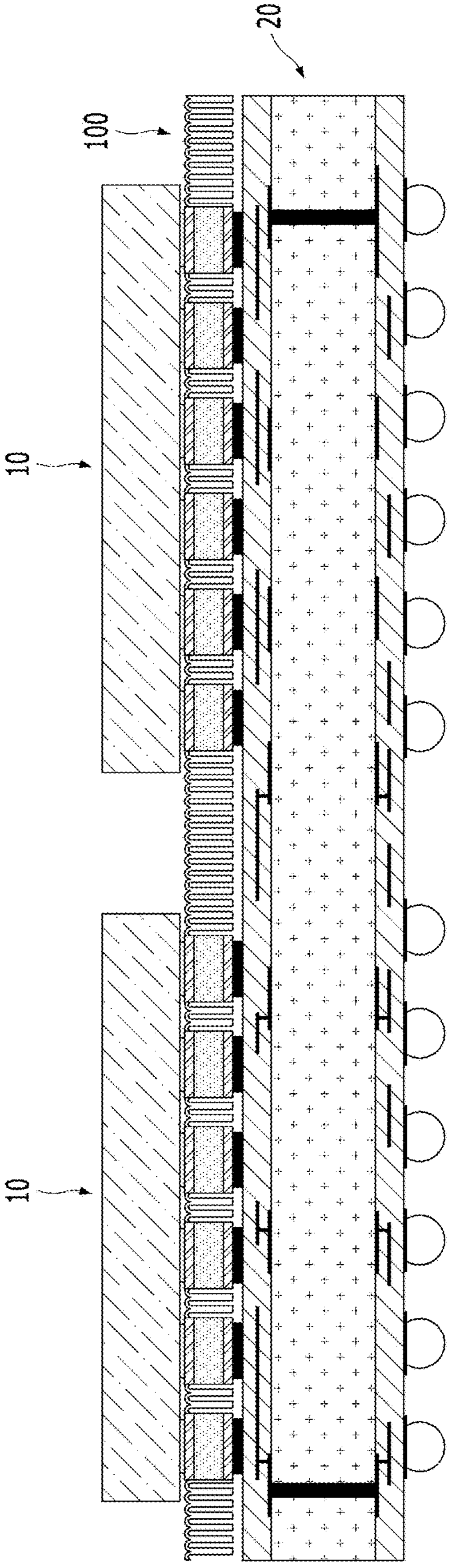

Meanwhile, as illustrated in FIGS. 11 and 12, the interposer 100 for electrical connection may be provided on the upper surface of the substrate 20 first, and then the semiconductor devices 10 may be transferred and provided on the upper surface of the interposer 100 for electrical connection. Each micro-bump 150 is bonded to each terminal 21 of the substrate 20 through the first bonding material 121 and is bonded to each terminal 11 of the semiconductor devices 10 through the second bonding material 123. With this, the semiconductor package 400 includes the semiconductor devices 10, the substrate 20 on which the semiconductor devices 10 are mounted, and the interposer 100 for electrical connection provided between the semiconductor devices 10 and the substrate 20.

Figure 13:
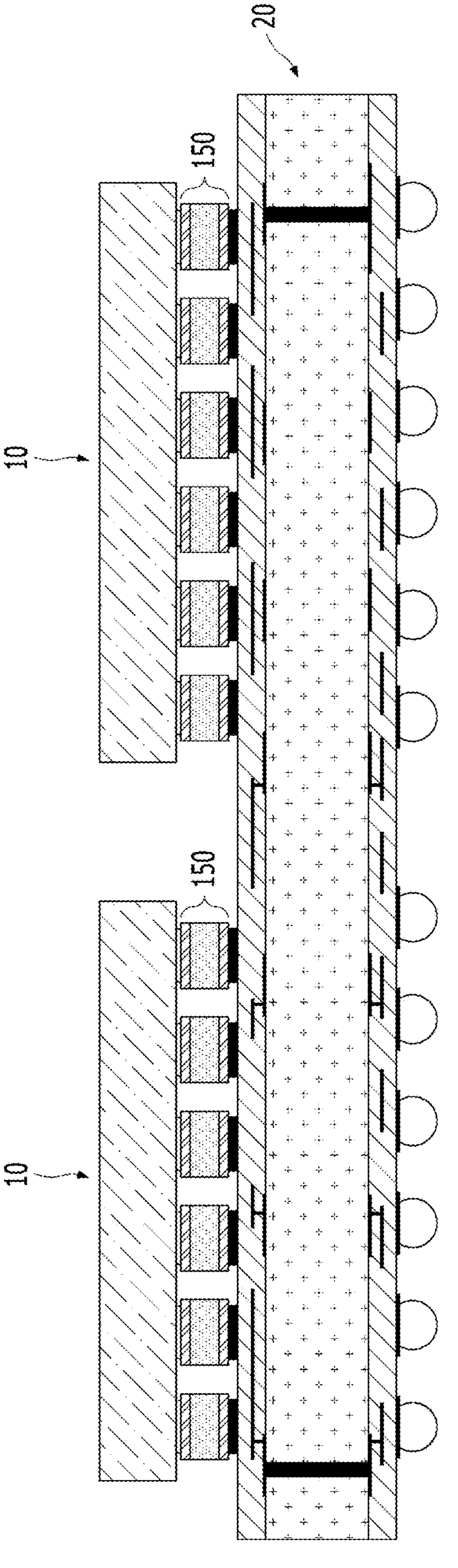

The semiconductor package 400 may be configured such that the body 110 made of the anodic aluminum oxide film is provided, or may be configured such that the body 110 is removed and only micro-bumps 150 remain as illustrated in FIG. 13. The body 110 may be selectively removed by a solution that selectively reacts only with the anodic aluminum oxide film.

Figure 14:
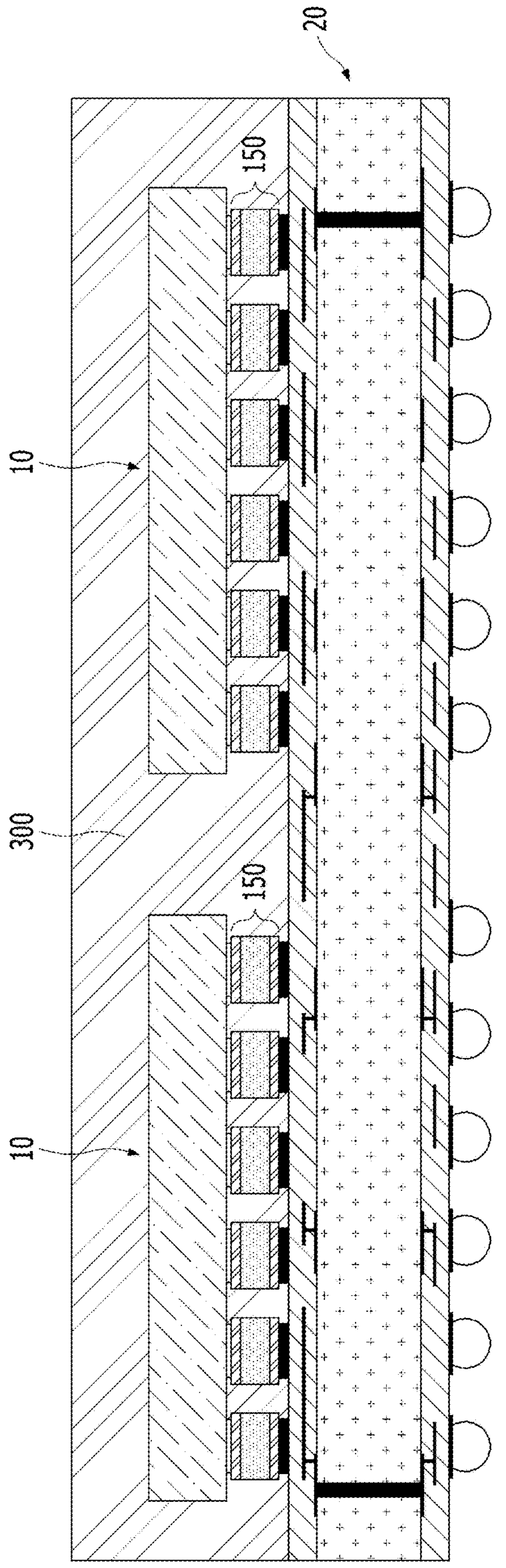

Next, referring to FIG. 14, a molding layer 300 for sealing the semiconductor devices 10 is formed. The molding layer 300 may include a polymer material. In some embodiments, the molding layer 300 may be a molding compound layer. The molding compound layer may include an epoxy-based resin in which a filler is dispersed. The filler may include insulating fibers, insulating particles, other suitable elements, or a combination thereof. Thereafter, a part of the molding layer 300 may be removed by chemical mechanical polishing (CMP) to expose upper surfaces of the semiconductor devices 10. Next, each individualized semiconductor package 400 is completed by cutting along a cutting line.

As described above, the semiconductor package 400 according to the exemplary embodiment of the present disclosure electrically connects the semiconductor device 10 and the substrate 20 each other by using the interposer 100 for electrical connection. Conventionally, bumps are manufactured by stacking the materials of the bumps on each terminal 11 of the semiconductor device 10, so the manufacturing process is cumbersome and the production yield is not high. However, according to the exemplary embodiment of the present disclosure, since the semiconductor device 10 and the substrate 20 are bonded using the separately manufactured interposer 100 for electrical connection, the manufacturing process is simple and the production yield is improved.

In addition, when the semiconductor device 10 and the substrate 20 are bonded using only solder bumps, there is a high possibility that a solder bump is melted and short-circuited with an adjacent solder bump. However, according to the exemplary embodiment of the present disclosure, by adopting the configuration of the electrically conductive material 130 provided between the upper and lower bonding materials 120 through the plating process, the possibility of a short-circuit between adjacent micro-bumps 150 can be minimized even when the upper and lower bonding materials 120 are melted.

In addition, when the semiconductor device 10 and the substrate 20 are bonded using only solder bumps, a problem occurs in that the current density and thermal energy are concentrated on a bump connection part. However, according to the exemplary embodiment of the present disclosure, by adopting the configuration of the electrically conductive material 130 provided between the upper and lower bonding materials 120, it is possible to alleviate the phenomenon in which the current density and thermal energy are concentrated on the micro-bump 150.

Hereinafter, a configuration in which a semiconductor package 400 is mounted on a circuit board 600 using an anodic aluminum oxide film-based interposer 100 for electrical connection and a manufacturing method therefor will be described.

Figure 15:
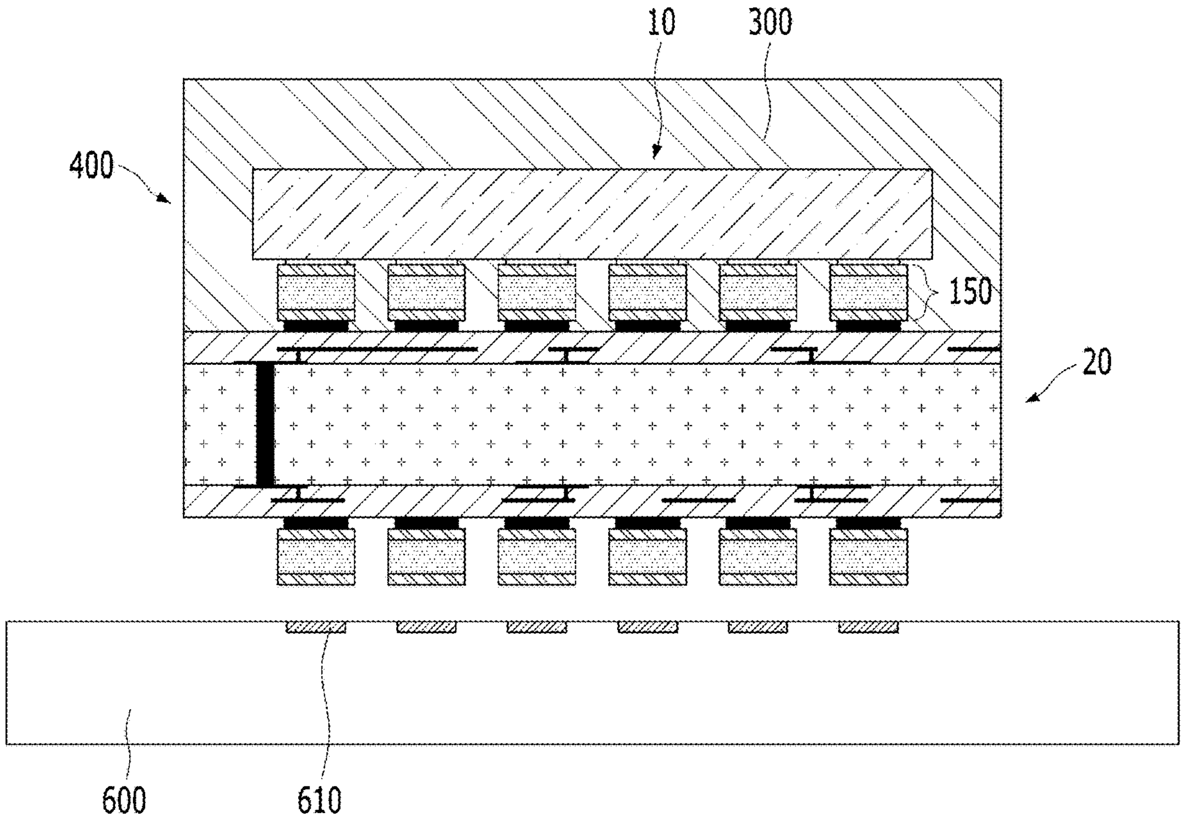
FIG. 15 is a view illustrating a state in which the semiconductor package according to the exemplary embodiment of the present disclosure is mounted on a circuit board.

Referring to FIG. 15, the interposer 100 for electrical connection according to an exemplary embodiment of the present disclosure may be provided under a substrate 20. That is, the semiconductor package 400 according to the exemplary embodiment of the present disclosure may include a semiconductor device 10; the substrate 20 on which the semiconductor device 10 is mounted; and the interposer 100 for electrical connection provided under the substrate 20. The interposer 100 for electrical connection may be additionally provided between the semiconductor device 10 and the substrate 20.

The interposer 100 for electrical connection may be provided between the substrate 20 and the circuit board 600 to bond the semiconductor package 400 to the circuit board 600. In this case, each micro-bump 150 of the interposer 100 for electrical connection may be provided at a position corresponding to each terminal 610 of the circuit board 600. A first bonding material 121 of each micro-bump 150 is bonded to each terminal 610 of the circuit board 600, and a second bonding material 123 of each micro-bump 150 is bonded to each terminal 21 of the substrate 20.

The manufacturing method for the semiconductor package 400 includes: providing an interposer 100 for electrical connection under a substrate 20, the interposer including a body 110 made of an anodic aluminum oxide film having a plurality of through-holes 111, an electrically conductive material 130 provided in each of the through-holes 111, and first and second bonding materials 121 and 123 formed on and under the electrically conductive material 130; and bonding the second bonding material 123 to a terminal 21 of the substrate 20.

Although FIG. 15 illustrates a state in which the body 110 made of the anodic aluminum oxide film is removed, a configuration in which the body 110 made of the anodic aluminum oxide film is provided in FIG. 15 is also included in one embodiment of the present disclosure.

That is, the semiconductor package 400 includes semiconductor device 10, the substrate 20 on which the semiconductor device 10 is mounted, and a plurality of micro-bumps 150 provided under the substrate 20. The micro-bumps 150 are formed in a column shape. A plurality of fine trenches 155 having repeated peaks and valleys in the circumferential direction are provided in an outer circumferential surface of each of the micro-bumps 150.

As described above, the semiconductor package 400 according to the exemplary embodiment of the present disclosure is electrically connected to the circuit board 600 by using the interposer 100 for electrical connection. Conventionally, bumps are manufactured by stacking the materials of the bumps on each terminal 21 of the semiconductor package 400, so the manufacturing process is cumbersome and the production yield is not high. However, according to the exemplary embodiment of the present disclosure, since the semiconductor package 400 and the circuit board 600 are bonded using the separately manufactured interposer 100 for electrical connection, the manufacturing process is simple and the production yield is improved.

In addition, when the semiconductor package 400 and the circuit board 600 are bonded using only solder bumps, there is a high possibility that a solder bump is melted and short-circuited with an adjacent solder bump. However, according to the exemplary embodiment of the present disclosure, by adopting the configuration of the electrically conductive material 130 provided between the upper and lower bonding materials 120 through the plating process, the possibility of a short-circuit between adjacent micro-bumps 150 can be minimized even when the upper and lower bonding materials 120 are melted.

In addition, when the semiconductor package 400 and the circuit board 600 are bonded using only solder bumps, a problem occurs in that the current density and thermal energy are concentrated on a bump connection part. However, according to the exemplary embodiment of the present disclosure, by adopting the configuration of the electrically conductive material 130 provided between the upper and lower bonding materials 120, it is possible to alleviate the phenomenon in which the current density and thermal energy are concentrated on the micro-bump 150.

Hereinafter, a multi-stacked semiconductor device 500 using an anodic aluminum oxide film-based interposer 100 for electrical connection and a manufacturing method therefor will be described.

Figure 16:
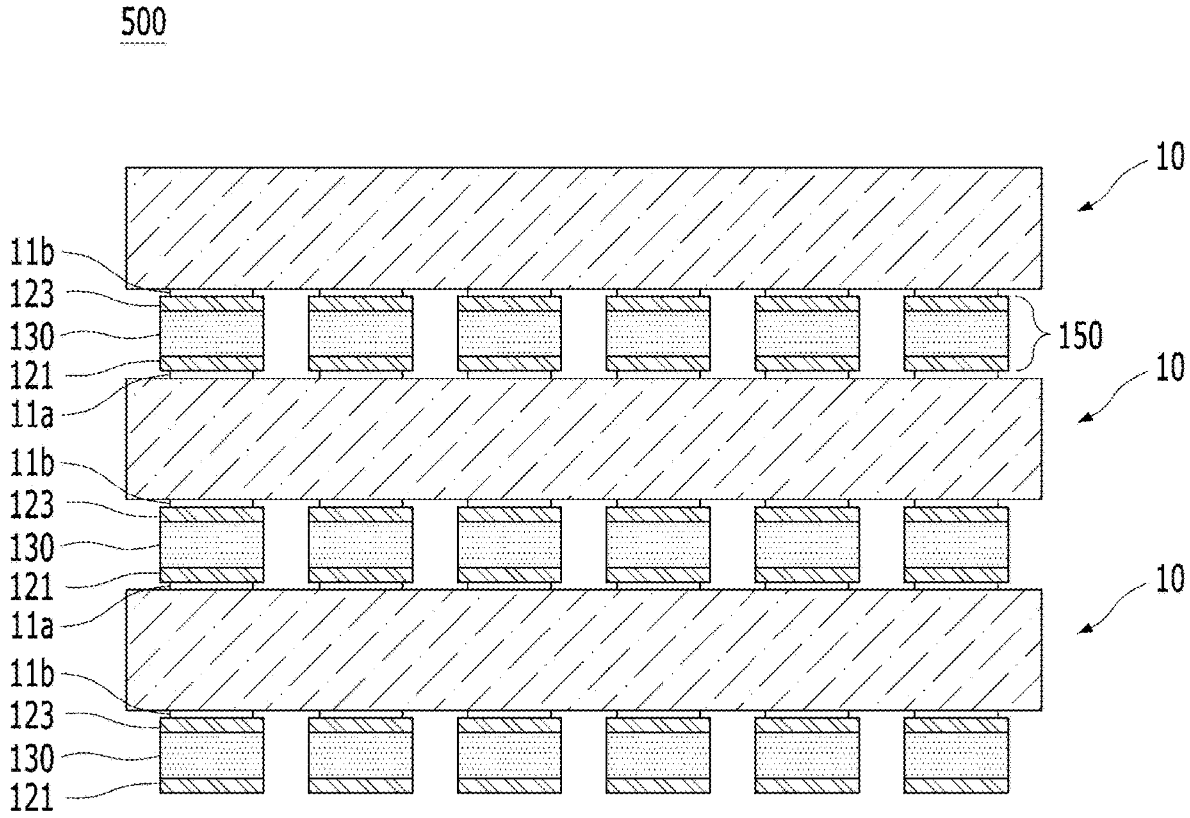
FIG. 16 is a sectional view illustrating a multi-stacked semiconductor device according to an exemplary embodiment of the present disclosure.

Referring to FIG. 16, the multi-stacked semiconductor device 500 is configured such that the interposer 100 for electrical connection according to an exemplary embodiment of the present disclosure is provided between semiconductor devices 10 adjacent in the upper and lower directions to electrically connect the semiconductor devices 10 adjacent in the upper and lower directions to each other. That is, the multi-stacked semiconductor device 500 includes a plurality of semiconductor devices 10 and the interposer 100 for electrical connection provided between the semiconductor devices 10.

Each first bonding material 121 of the interposer 100 for electrical connection is bonded to each upper terminal 11*a* of a semiconductor device 10 located therebelow, and a second bonding material 123 is bonded to a lower terminal 11*b* of a semiconductor device 10 located thereabove. With this, the multi-stacked semiconductor device 500 in which the semiconductor devices 10 are stacked in multiple stages is formed.

The manufacturing method for the multi-stacked semiconductor device 500 includes: providing an interposer 100 for electrical connection between a plurality of semiconductor devices 10, the interposer including a body 110 made of an anodic aluminum oxide film having a plurality of through-holes 111, an electrically conductive material 130 provided in each of the through-holes 111, and first and second bonding materials 121 and 123 formed on and under the electrically conductive material 130; and bonding the first bonding material 121 to a terminal 11*a* of a semiconductor device 10 located thereabove and bonding the second bonding material 123 to a terminal 11*b* of a semiconductor device 10 located therebelow. The manufacturing method may further include removing the body 110 made of the anodic aluminum oxide film after the semiconductor devices 10 adjacent in the upper and lower directions are all bonded together through a plurality of micro-bumps 150.

Although FIG. 16 illustrates a state in which the body 110 made of the anodic aluminum oxide film is removed, a configuration in which the body 110 made of the anodic aluminum oxide film is provided in FIG. 16 is also included in one embodiment of the present disclosure.

The multi-stacked semiconductor device 500 includes the plurality of semiconductor devices 10 and the plurality of micro-bumps 150 provided between the semiconductor devices 10. The micro-bumps 150 are formed in a column shape. A plurality of fine trenches 155 having repeated peaks and valleys in the circumferential direction are provided in an outer circumferential surface of each of the micro-bumps 150. The fine trenches 155 have a corrugated shape in which peaks and valleys with a depth in the range of 20 nm to 1 μm are repeated in the circumferential direction and thus have an effect of increasing the surface area of a side surface of the micro-bump 150.

As described above, the multi-stacked semiconductor device 500 according to the exemplary embodiment of the present disclosure electrically connects the semiconductor devices 10 adjacent in the upper and lower directions to each other by using the interposer 100 for electrical connection. According to the exemplary embodiment of the present disclosure, the semiconductor devices 10 adjacent in the upper and lower directions are bonded using the separately manufactured interposer 100 for electrical connection, the manufacturing process is simple and the production yield is improved.

In addition, when the semiconductor devices 10 adjacent in the upper and lower directions are bonded using only solder bumps, there is a high possibility that a solder bump is melted and short-circuited with an adjacent solder bump. However, according to the exemplary embodiment of the present disclosure, by adopting the configuration of the electrically conductive material 130 provided between the upper and lower bonding materials 120 through the plating process, the possibility of a short-circuit between adjacent micro-bumps 150 can be minimized even when the upper and lower bonding materials 120 are melted.

In addition, when the semiconductor devices 10 adjacent in the upper and lower directions are bonded using only solder bumps, a problem occurs in that the current density and thermal energy are concentrated on a bump connection part. However, according to the exemplary embodiment of the present disclosure, by adopting the configuration of the electrically conductive material 130 provided between the upper and lower bonding materials 120, it is possible to alleviate the phenomenon in which the current density and thermal energy are concentrated on the micro-bump 150.

Hereinafter, a display using an anodic aluminum oxide film-based interposer 100 for electrical connection and a manufacturing method therefor will be described.

The display according to an exemplary embodiment of the present disclosure includes: a semiconductor device 10; a substrate 20 on which the semiconductor device 10 is mounted; and the interposer 100 for electrical connection provided between the semiconductor device 10 and the substrate 20. The interposer 100 for electrical connection includes: a body 110 made of an anodic aluminum oxide film having a plurality of through-holes 111; an electrically conductive material 130 provided in each of the through-holes 111; and a bonding material 120 provided in each of the through-holes 111 and provided at least a part of on and under the electrically conductive material 130.

Here, the semiconductor device 10 is a semiconductor LED, and includes a mini LED and a micro-LED. In addition, the substrate 20 may be a circuit board having wiring lines.

The display according to the exemplary embodiment of the present disclosure may be configured such that the body 110 made of the anodic aluminum oxide film is removed selectively.

Each terminal 11 of the semiconductor device 10 and each terminal 21 of the substrate 20 are electrically connected to each other by an electrically conductive material 130, the electrically conductive material 130 and each terminal of the substrate 20 are bonded by a first bonding material 121, and the electrically conductive material 130 and each terminal of the semiconductor device 10 are bonded by a second bonding material 123.

Hereinafter, the manufacturing method for the display according to the exemplary embodiment of the present disclosure will be described with reference to FIGS. 17A to 20B.

The manufacturing method for the display according to the exemplary embodiment of the present disclosure includes: providing an interposer 100 for electrical connection between a semiconductor device 10 and a substrate 20, the interposer including a body 110 made of an anodic aluminum oxide film having a plurality of through-holes 111, an electrically conductive material 130 provided in each of the through-holes 111, and first and second bonding materials 121 and 123 formed on and under the electrically conductive material 130; and bonding the first bonding material 121 to a terminal 21 of the substrate 20 and bonding the second bonding material 123 to a terminal 11 of the semiconductor device 10.

Figure 17A:
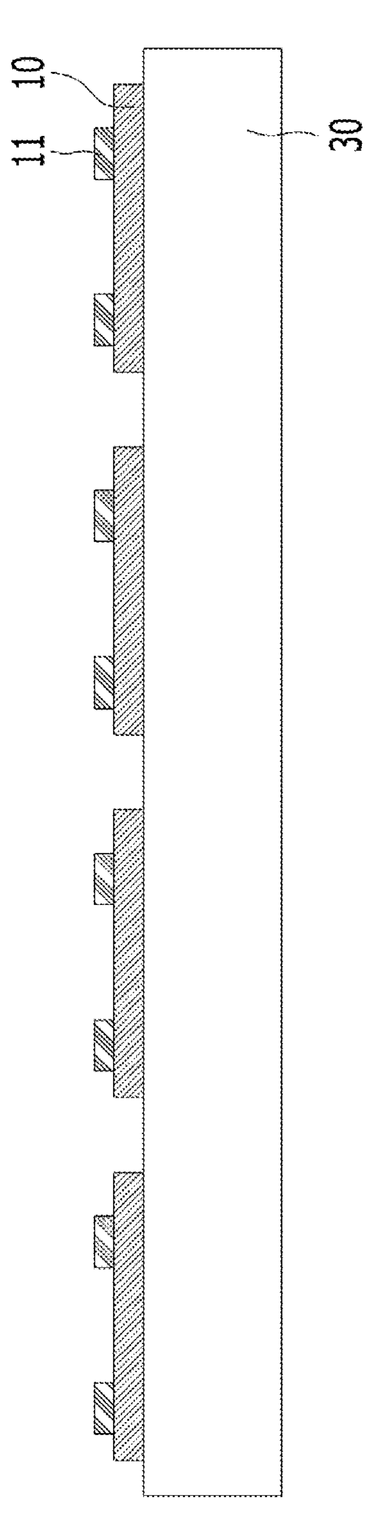
FIGS. 17A to 20B are views illustrating a manufacturing method for a display according to an exemplary embodiment of the present disclosure.

First, referring to FIG. 17A, semiconductor devices 10 are fabricated and disposed on a growth substrate 30. The growth substrate 30 may be configured as a conductive substrate or an insulating substrate. For example, the growth substrate 30 may be made of at least one selected from among sapphire, SiC, Si, GaAs, GaN, ZnO, Si, GaP, InP, Ge, and $Ga_2O_3$.

Each of the semiconductor devices 10 may include a first semiconductor layer, a second semiconductor layer, and an active layer provided between the first semiconductor layer and the second semiconductor layer. The first semiconductor layer, the active layer, and the second semiconductor layer may be formed using metal organic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like. The first semiconductor layer may be implemented, for example, as a p-type semiconductor layer. A p-type semiconductor layer may be made of a semiconductor material having a composition formula of InxAlyGa1-x-yN ($0 \le x \le 1$, $0 \le y \le 1$, $0 \le x+y \le 1$) selected from among, for example, GaN, AlN, AlGaN, InGaN, InN, InAlGaN, AlInN, and the like, and the layer may be doped with a p-type dopant such as Mg, Zn, Ca, Sr, or Ba. The second semiconductor layer may include, for example, an n-type semiconductor layer. An n-type semiconductor layer may be made of a semiconductor material having a composition formula of InxAlyGa1-x-yN ($0 \le x \le 1$, $0 \le y \le 1$, $0 \le x+y \le 1$) selected from among, for example, GaN, AlN, AlGaN, InGaN, InN, InAlGaN, AlInN, and the like, and the layer may be doped with an n-type dopant such as Si, Ge, or Sn. The active layer is a region where electrons and holes are recombined. As the electrons and the holes are recombined, the active layer transits to a low energy level and generates light having a wavelength corresponding thereto. The active layer may be made of a semiconductor material having a composition formula of InxAlyGa1-x-yN (0≤x≤1, 0≤y≤1, 0≤x+y≤1) and may have a single quantum well structure or a multi-quantum well (MQW) structure. In addition, the active layer may have a quantum wire structure or a quantum dot structure.

Each of the semiconductor devices 10 includes at least two terminals 11. The terminals 11 may be all provided on one surface of the semiconductor device 10 or may be respectively provided on opposite surfaces of the semiconductor device 10. However, in FIGS. 17A, 17B, and 17C, it is illustrated that the terminals 11 are all provided on one surface of the semiconductor device 10. Each of the terminals 11 may include at least one layer and may be made of various conductive materials including a metal, conductive oxide, and conductive polymer.

The semiconductor devices 10 are separated into individual pieces by cutting along a cutting line using a laser or the like or by etching.

Meanwhile, in the previous description, the semiconductor devices 10 have been described as being fabricated on the growth substrate 30 and provided on the growth substrate 30. However, the semiconductor devices 10 fabricated on the growth substrate 30 may be provided by being transferred from the growth substrate 30 to a temporary substrate or an intermediate substrate. Thus, the exemplary embodiment of the present disclosure includes a case in which the growth substrate 30 illustrated in FIG. 17A is a temporary substrate or an intermediate substrate.

Figure 17B:
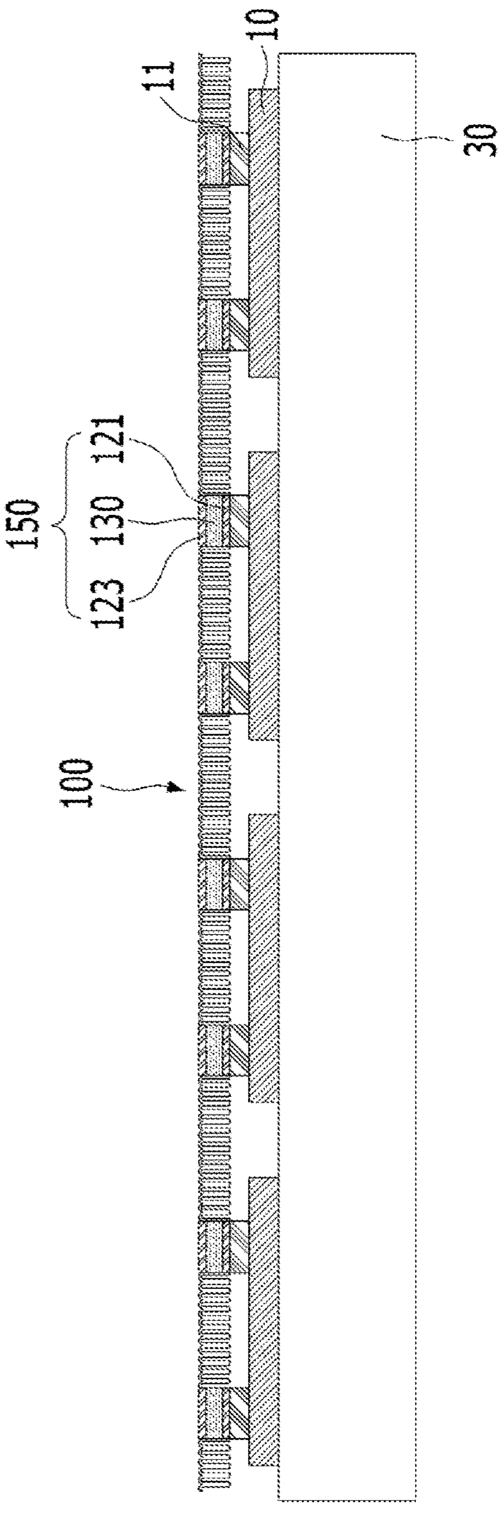

Next, referring to FIG. 17B, the anodic aluminum oxide film-based interposer 100 for electrical connection is provided on the semiconductor devices 10. Each micro-bump 150 of the anodic aluminum oxide film-based interposer 100 for electrical connection is positioned to correspond to each terminal 11 of the semiconductor devices 10. Specifically, two terminals 11 are provided on one surface of one semiconductor device 10, and each micro-bump 150 of the anodic aluminum oxide film-based interposer 100 for electrical connection is provided to correspond to each of the two terminals 11.

Figure 17C:
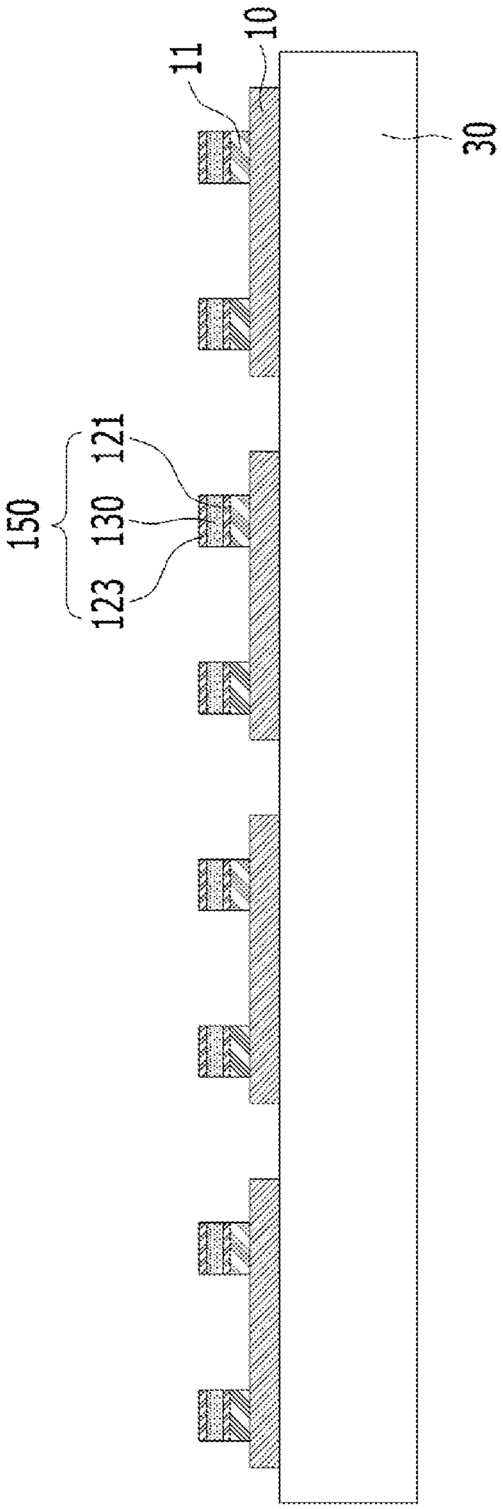

Next, referring to FIG. 17C, the first bonding material 121 of each micro-bump 150 is bonded to each terminal 11 of the semiconductor devices 10. Next, only the body 110 made of the anodic aluminum oxide film is selectively removed from the anodic aluminum oxide film-based interposer 100 for electrical connection by using an etching solution.

Figure 18A:
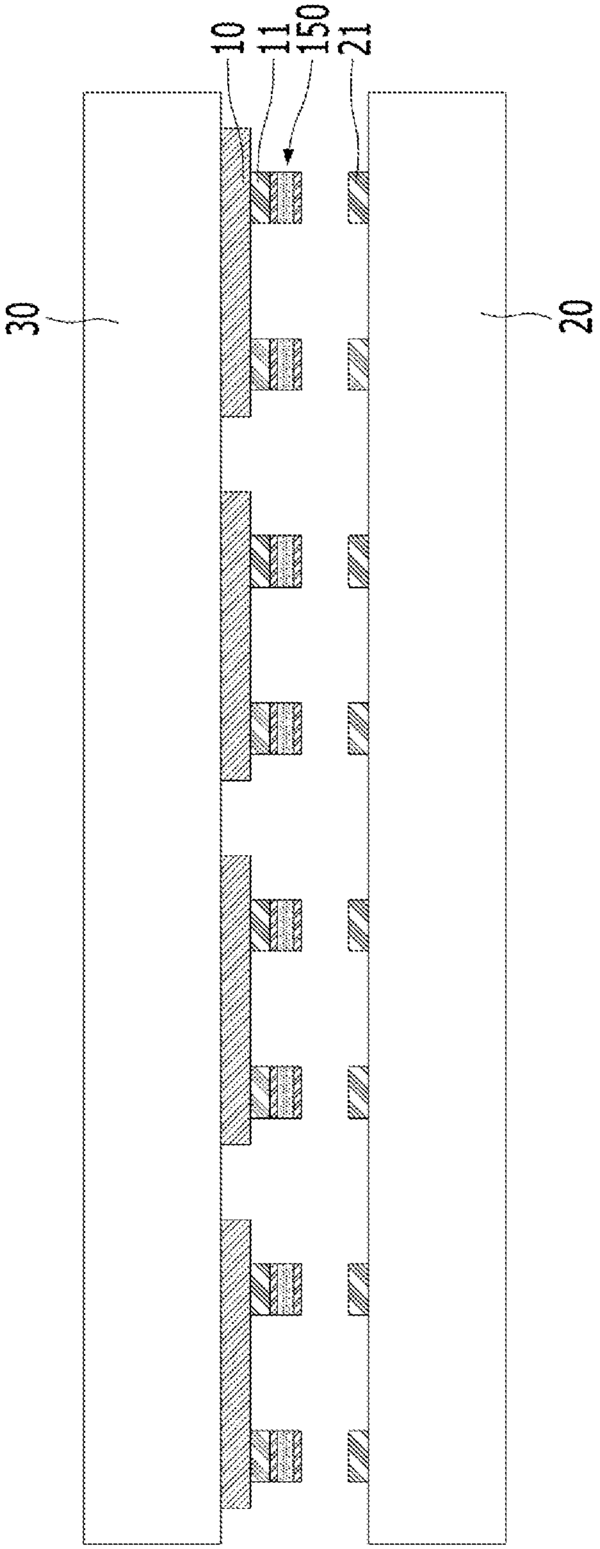

Next, referring to FIG. 18A, the semiconductor devices 10 are inverted and transferred toward the substrate 20. Terminals 21 are provided on an upper surface of the substrate 20 at positions corresponding to the terminals 11 of the semiconductor devices 10. After aligning the positions of the terminals 11 of the semiconductor devices 10 and the positions of the terminals 21 of the substrate 20 with each other, the semiconductor devices 10 and the substrate 20 are moved relative to each other to approach each other.

Here, the substrate 20 is a display substrate and may include various materials. For example, the substrate 20 may be made of a transparent glass material having SiO2 as a main component. However, the substrate 20 is not limited thereto, and may be made of a transparent plastic material and thus have solubility. The plastic material may be an organic substance selected from among organic insulating substances, including polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP). In the case of a bottom emission type in which an image is implemented in a direction of the substrate 20, the substrate 20 is required to be made of a transparent material. However, in the case of a top emission type in which an image is implemented in a direction opposite to the substrate 20, the substrate 20 is not necessarily required to be made of a transparent material. In this case, the substrate 20 may be made of a metal. In the case of forming the substrate 20 using a metal, the substrate 20 may be made of at least one metal selected from among iron, chromium, manganese, nickel, titanium, molybdenum, stainless steel (SUS), Invar alloy, Inconel alloy, and Kovar alloy, but is not limited thereto.

Figure 18B:
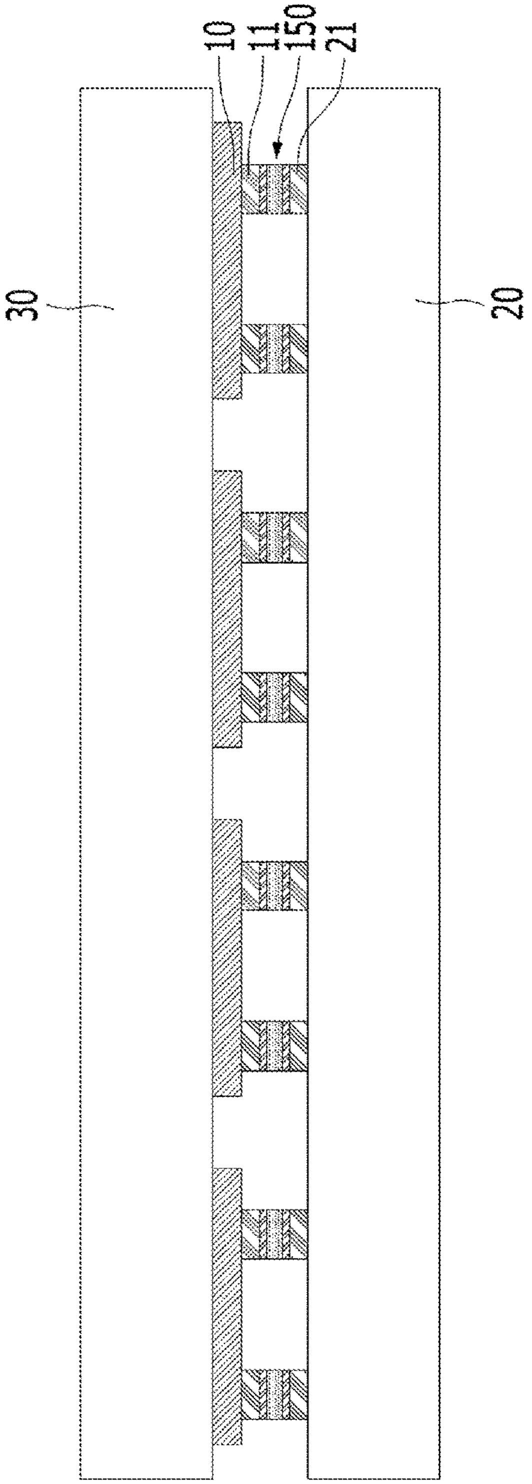

Next, referring to FIG. 18B, the semiconductor devices 10 are bonded to the substrate 20. The second bonding material 123 of each micro-bump 150 and each terminal 21 of the substrate 20 are bonded together.

Figure 18C:
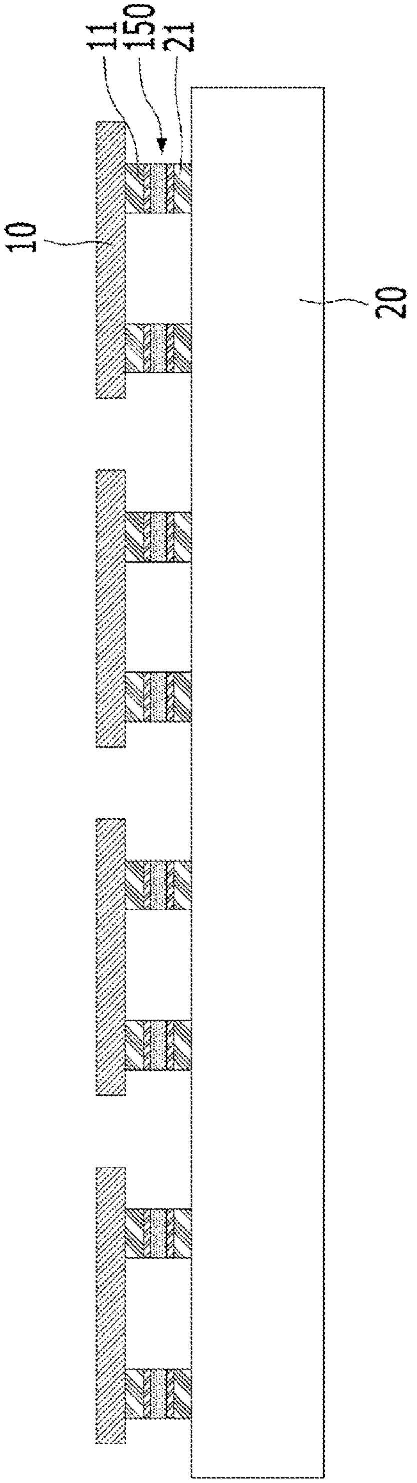

Next, referring to FIG. 18C, the growth substrate 30 is separated from the semiconductor devices 10. For example, the growth substrate 30 may be separated from the semiconductor devices 10 by a laser lift-off process.

In FIGS. 17A, 17B, and 17C and FIGS. 18A, 18B, and 18C, it has been described that the semiconductor devices 10 are bonded to the anodic aluminum oxide film-based interposer 100 for electrical connection first and then bonded to the substrate 20. However, as illustrated in FIGS. 19A, 19B, and 19C and FIGS. 20A and 20B, the display may be manufactured with a different process order, i.e., bonding the anodic aluminum oxide film-based interposer 100 for electrical connection to the substrate 20 first and then bonding the semiconductor devices 10 to the interposer.

Figure 19A:
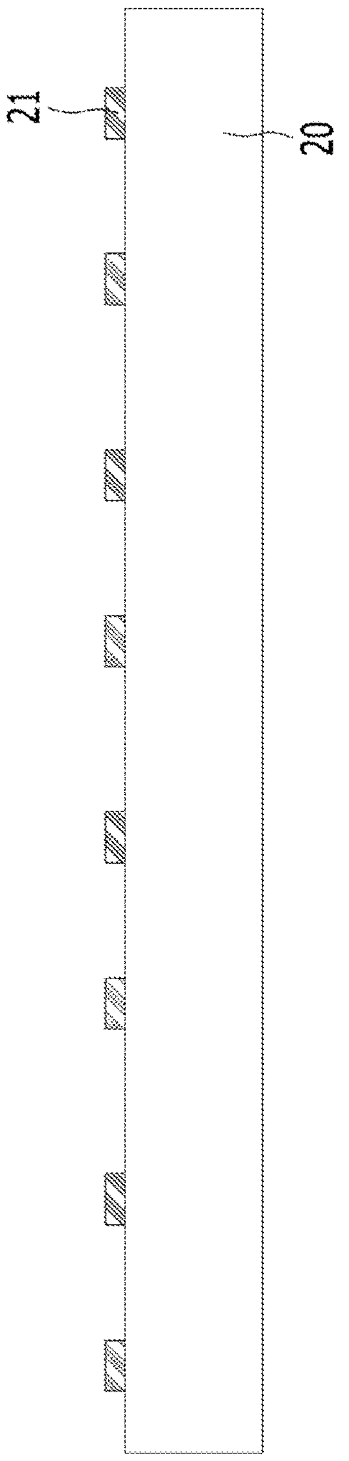

First, referring to FIG. 19A, the substrate 20 having the terminals 21 on the upper surface thereof is prepared.

Figure 19B:
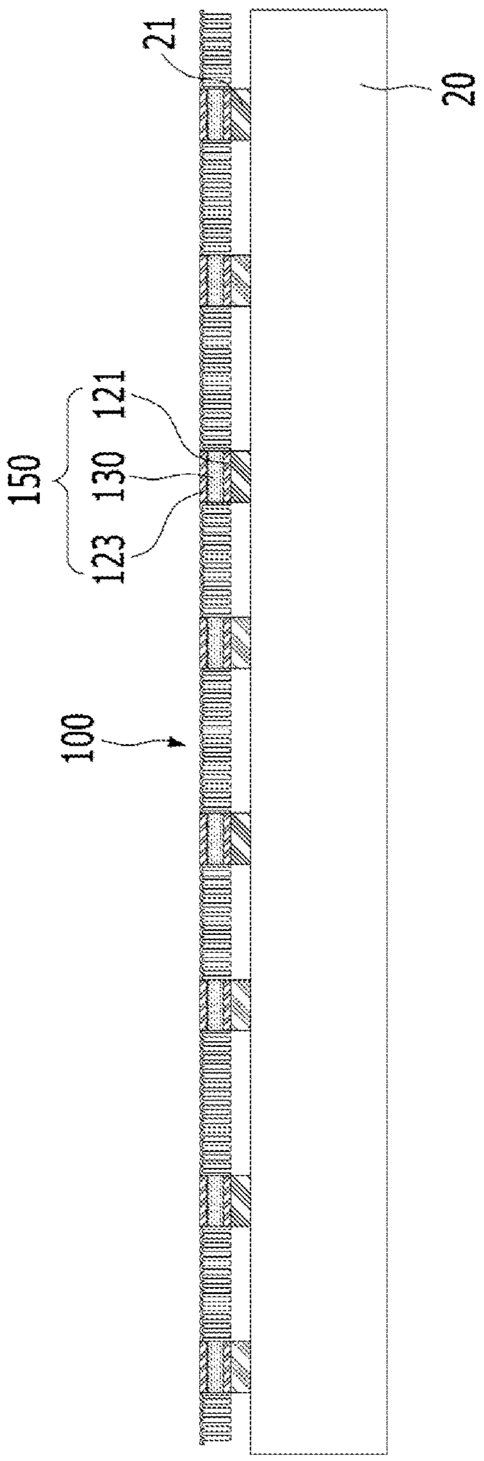

Next, referring to FIG. 19B, the anodic aluminum oxide film-based interposer 100 is aligned on the substrate 20, and the first bonding material 121 of each micro-bump 150 is bonded to each terminal 21 of the substrate 20.

Figure 19C:
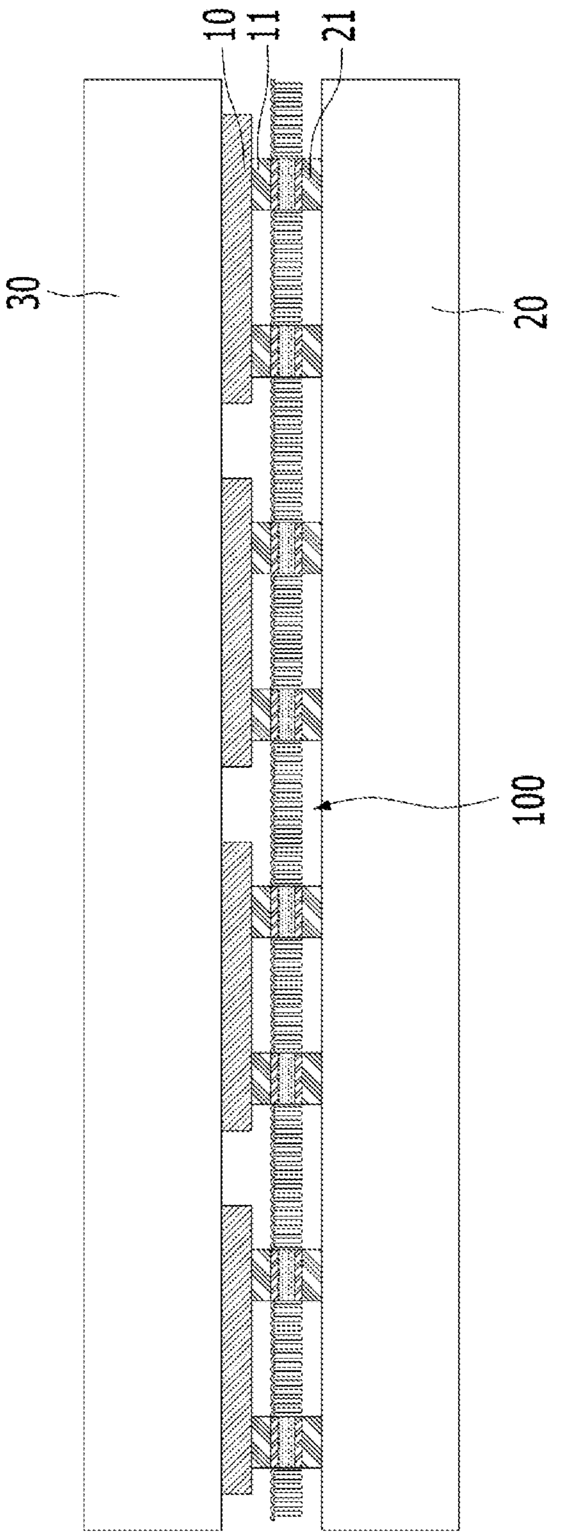

Next, referring to FIG. 19C, the semiconductor devices 10 fabricated on the growth substrate 30 are positioned on the anodic aluminum oxide film-based interposer 100, and then each terminal 11 of the semiconductor devices 10 is bonded to the second bonding material 123 of each micro-bump 150. Here, the semiconductor devices 10 may be in a state of being supported by the growth substrate 30, or may be in a state of being supported by a temporary substrate or an intermediate substrate after being fabricated on the growth substrate 30 and transferred to the temporary substrate or the intermediate substrate.

On the other hand, without bonding the first bonding material 121 to the terminal of the substrate 20 in the structure illustrated in FIG. 19B, the first bonding material 121 and the second bonding material 123 may be simultaneously bonded to the respective terminals 11 and 21 by a single bonding process in the structure illustrated in FIG. 19C.

Figure 20A:
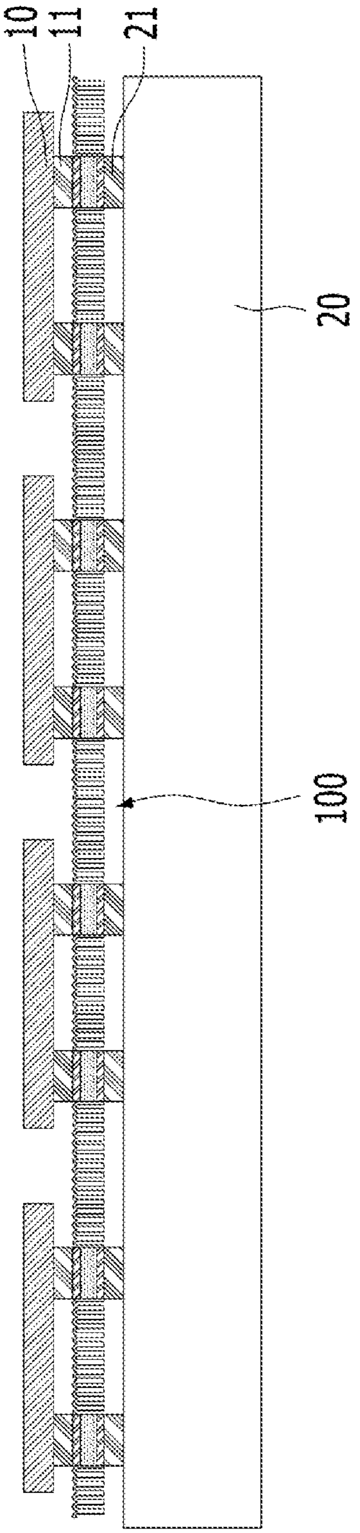

Next, referring to FIG. 20A, the growth substrate 30 is separated from the semiconductor devices 10. For example, the growth substrate 30 may be separated from the semiconductor devices 10 by a laser lift-off process.

Figure 20B:
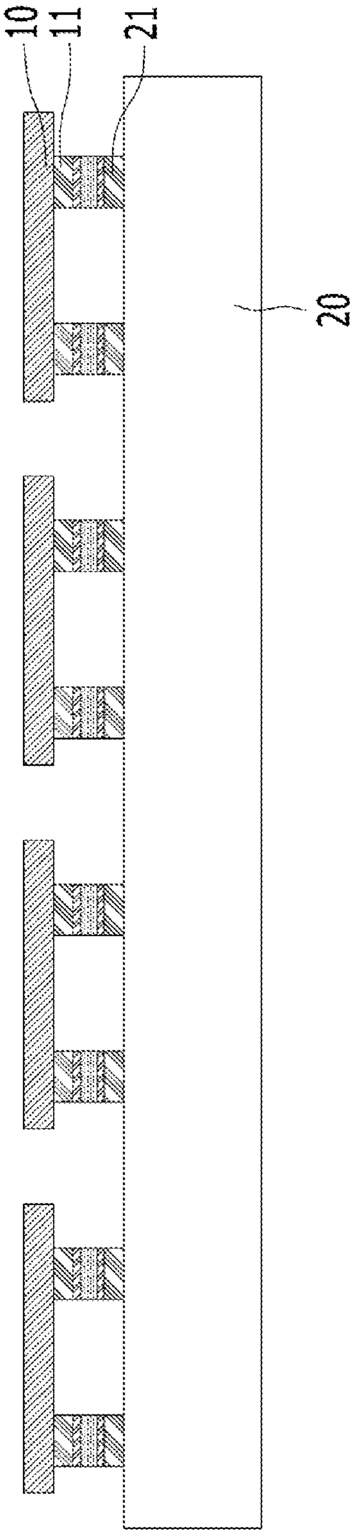

Next, as illustrated in FIG. 20B, only the body 110 made of the anodic aluminum oxide film is selectively removed from the anodic aluminum oxide film-based interposer 100 by using an etching solution. With this, the semiconductor devices 10 are electrically connected to the substrate 20 by a plurality of micro-bumps 150. Specifically, each micro-bump 150 is bonded to each terminal 21 of the substrate 20 through the first bonding material 121, and each micro-bump 150 is bonded to each terminal 11 of the semiconductor devices 10 through the second bonding material 123.

The display including the semiconductor device 10 such as a mini LED or a micro-LED includes the semiconductor device 10 such as a mini LED or a micro-LED, the substrate 20 on which the semiconductor device 10 is mounted, and the plurality of micro-bumps 150 provided between the semiconductor device 10 and the substrate 20. The micro-bumps 150 are formed in a column shape. A plurality of fine trenches 155 having repeated peaks and valleys in the circumferential direction are provided in an outer circumferential surface of each of the micro-bumps 150. The fine trenches 155 have a corrugated shape in which peaks and valleys with a depth in the range of 20 nm to 1 μm are repeated in the circumferential direction and thus have an effect of increasing the surface area of a side surface of the micro-bump 150.

The semiconductor device 10, such as a mini LED or a micro-LED, has a small size (horizontal and vertical lengths) in the range of several to tens of micrometers, and thus the distance between the terminals 11 provided on the semiconductor device 10 is also very narrow, ranging from several to tens of micrometers. According to the exemplary embodiment of the present disclosure, it is possible to reliably bond the semiconductor device 10 to the terminals 21 of the substrate 20 even within the above dimensional range of the semiconductor device 10.

As described above, the display according to the exemplary embodiment of the present disclosure electrically connects the semiconductor device 10 and the substrate 20 each other by using the interposer 100 for electrical connection. According to the exemplary embodiment of the present disclosure, since the semiconductor device 10 and the substrate 20 are bonded using the separately manufactured interposer 100 for electrical connection, the manufacturing process is simple and the production yield is improved.

In addition, when the semiconductor device 10 and the substrate 20 are bonded using only solder bumps, there is a high possibility that a solder bump is melted and short-circuited with an adjacent solder bump. However, according to the exemplary embodiment of the present disclosure, by adopting the configuration of the electrically conductive material 130 provided between the upper and lower bonding materials 120 through the plating process, the possibility of a short-circuit between adjacent micro-bumps 150 can be minimized even when the upper and lower bonding materials 120 are melted.

In addition, when the semiconductor device 10 and the substrate 20 are bonded using only solder bumps, a problem occurs in that the current density and thermal energy are concentrated on a bump connection part. However, according to the exemplary embodiment of the present disclosure, by adopting the configuration of the electrically conductive material 130 provided between the upper and lower bonding materials 120, it is possible to alleviate the phenomenon in which the current density and thermal energy are concentrated on the micro-bump 150.

Although the exemplary embodiments of the present disclosure have been described for illustrative purposes, those skilled in the art will appreciate that various modifications, additions, and substitutions are possible, without departing from the scope and spirit of the present disclosure as disclosed in the accompanying claims.

DESCRIPTION OF THE REFERENCE NUMERALS IN THE DRAWINGS

10: semiconductor device
20: substrate
100: interposer for electrical connection
110: body
120: bonding material
130: electrically conductive material
200: seed layer
300: molding layer
400: semiconductor package
500: multi-stacked semiconductor device
600: circuit board

The invention claimed is:

1. An anodic aluminum oxide film-based interposer for electrical connection, the interposer comprising:

a body made of an anodic aluminum oxide film having pores and a plurality of through-holes each having a width greater than a width of the pores;

an electrically conductive material provided in each of the through-holes; and a bonding material provided in each of the through-holes and provided on at least a part of an upper portion and a lower portion of the electrically conductive material, the bonding material being configured to be melted for bonding, wherein the electrically conductive material and the bonding material are sequentially stacked in each of the through-holes to form a column-shaped micro-bump, and wherein an outer circumferential surface of the micro-bump is provided with a plurality of fine trenches having repeated peaks and valleys in a circumferential direction.

2. The interposer of claim 1, wherein the electrically conductive material is made of at least one selected from among Cu, Al, W, Au, Ag, Mo, Ta, and an alloy containing these metals, and the bonding material is made of at least one selected from among Sn, AgSn, Au, PbSn, SnAgCu, SnAgBi, AuSn, In, InSn, and an alloy containing Sn.

3. The interposer of claim 1, wherein the bonding material comprises:

a first bonding material provided under the electrically conductive material; and a second bonding material provided on the electrically conductive material.

4. The interposer of claim 1, wherein the bonding material and the electrically conductive material have the same height as a height of the body.

* * * * *